United States Patent
Mizuno et al.

(10) Patent No.: US 6,987,415 B2
(45) Date of Patent: Jan. 17, 2006

(54) SEMICONDUCTOR INTEGRATED CIRCUIT

(75) Inventors: Hiroyuki Mizuno, Kokubunji (JP);
Koichiro Ishibashi, Warabi (JP);
Takanori Shimura, Chiba (JP);
Toshihiro Hattori, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/765,923

(22) Filed: Jan. 29, 2004

(65) Prior Publication Data

US 2004/0183585 A1 Sep. 23, 2004

Related U.S. Application Data

(63) Continuation of application No. 10/443,018, filed on May 22, 2003, now Pat. No. 6,707,334, which is a continuation of application No. 10/247,525, filed on Sep. 20, 2002, now Pat. No. 6,600,360, which is a continuation of application No. 09/582,485, filed on Jun. 23, 2000, now Pat. No. 6,483,374.

(30) Foreign Application Priority Data

Dec. 26, 1997 (JP) ............................................. 9-359271

(51) Int. Cl.
*H03K 3/01* (2006.01)

(52) U.S. Cl. ..................................................... 327/534
(58) Field of Classification Search ................ 327/142, 327/143, 530, 534, 535, 537
See application file for complete search history.

(56) References Cited

U.S. PATENT DOCUMENTS 4,628,215 A    12/1986  Lou ............................ 307/200

(Continued)

FOREIGN PATENT DOCUMENTS

| JP | 60-020550  | 2/1985  |
|----|------------|---------|
| JP | 01-098254  | 4/1989  |
| JP | 01-318261  | 12/1989 |
| JP | 02-154446  | 6/1990  |
| JP | 04-345061  | 12/1992 |
| JP | 05-190672  | 7/1993  |
| JP | 06-053496  | 2/1994  |
| JP | 7-254685   | 10/1995 |
| JP | 8-83487    | 3/1996  |
| JP | 8-204140   | 8/1996  |
| JP | 08-249882  | 9/1996  |

OTHER PUBLICATIONS

Kiyoo Ito, "VLSI Memory" p. 266, published by Baifukan.

Soden et al., "Identifying Defects in Deep–Submicron CMOS Ics", Sep. 1996, pp. 66–71, IEEE SPECTRUM.

Mizuno et al., "A Lean–Power Gigascale LSI Using Hierarchical VBB Routing Scheme with Frequency Adaptive VT CMOS", 1997 pp. 95–96, Symposium on VLS Circuits Digest of Technical Papers.

*Primary Examiner*—Jeffrey Zweizig
(74) *Attorney, Agent, or Firm*—Kenyon & Kenyon

(57) ABSTRACT

In order to provide a semiconductor IC unit such as a microprocessor, etc., which satisfies both fast operation and lower power consumption properties with its high quality kept, the semiconductor IC unit of the present invention is composed so as to include a main circuit (LOG) provided with transistors, which is formed on a semiconductor substrate, and a substrate bias controlling circuit (VBC) used for controlling a voltage to be applied to the substrate, and the main circuit includes switching transistors (MN1 and MP1) used for controlling a voltage to be applied to the substrate and control signals output from the substrate bias controlling circuit is entered to the gate of each of the switching transistors and the control signal is returned to the substrate bias controlling circuit.

6 Claims, 25 Drawing Sheets

U.S. PATENT DOCUMENTS

| | | | | |
|---|---|---|---|---|
| 5,448,198 A | * | 9/1995 | Toyoshima et al. | 327/530 |
| 5,461,338 A | * | 10/1995 | Hirayama et al. | 327/534 |
| 5,610,533 A | | 3/1997 | Arimoto et al. | 326/33 |
| 5,659,517 A | | 8/1997 | Arimoto et al. | 365/226 |
| 5,721,510 A | | 2/1998 | Miyajima | 327/536 |
| 5,786,724 A | | 7/1998 | Teggatz | 327/534 |
| 5,828,697 A | * | 10/1998 | Shin | 375/222 |
| 5,909,140 A | * | 6/1999 | Choi | 327/534 |
| 6,046,627 A | | 4/2000 | Itoh et al. | 327/546 |
| 6,097,113 A | | 8/2000 | Teraoka et al. | 307/125 |
| 6,177,831 B1 | | 1/2001 | Yoneda et al. | 327/537 |
| 6,191,615 B1 | | 2/2001 | Koga | 326/81 |
| 6,292,015 B1 | | 9/2001 | Ooishi et al. | 326/33 |
| 6,337,593 B1 | | 1/2002 | Mizuno et al. | 327/534 |
| 6,380,798 B1 | | 4/2002 | Mizuno et al. | 327/534 |

* cited by examiner

SEMICONDUCTOR INTEGRATED CIRCUIT

This is a continuation of application Ser. No. 10/443,018, filed 22 May 2003, U.S. Pat. No. 6,707,334; which is a continuation of application Ser. No. 10/247,525, filed 20 Sep. 2002, U.S. Pat. No. 6,600,360; which is a continuation of application Ser. No. 09/582,485, filed 23 Jun. 2000, U.S. Pat. No. 6,483,374.

TECHNICAL FIELD

The present invention relates to a semiconductor IC unit, more particularly to a semiconductor IC unit provided with both fast operation and low power consumption properties.

The present application follows part of the US patent application No. PCT/JP97/04253 filed on Nov. 21, 1997. The contents of the preceding US patent application are cited and combined with the present application.

BACKGROUND ART

At present, CMOS integrated circuits (IC) are used widely to form a semiconductor IC unit such as a microprocessor, etc. A CMOS IC consumes an electric power in two ways; dynamic power consumption and static power consumption. The dynamic power consumption is caused by charging and discharging at a switching time and the static power consumption is caused by a subthreshold leakage current. The dynamic power consumption consumes a large current in proportion to the square of a supply voltage VDD, so the supply voltage should be lowered to save the power consumption of the object CMOS IC effectively. In recent years, the supply voltage is thus getting lower and lower to cope with such an object.

On the other hand, some of the power-saving microprocessors available at present are provided with a power management feature and its processor is provided with a plurality of operation modes, so that supply of the clock to an active unit is stopped at its standby time according to the set operation mode.

Since the supply of the clock is stopped such way, it is possible to reduce unnecessary dynamic power consumption in such an active unit as much as possible. However, the static power consumption caused by a subthreshold leakage current cannot be reduced and still remains on the same level at this time.

The operation speed of a CMOS circuit drops at a low supply voltage. In order to prevent such a speed reduction of a CMOS circuit, therefore, the threshold voltage of the MOS transistor must be lowered in conjunction with the drop of the supply voltage. If a threshold voltage is lowered, however, the subthreshold leakage current increases extremely. And, as the supply voltage is getting lower, the static power consumption increases more remarkably due to the subthreshold leakage current, which has not been so much conventionally. This is why it is now urgently required to realize a semiconductor IC unit such as a microprocessor, which can satisfy both fast operation and low power consumption properties.

In order to solve the above problem, for example, the official gazette of Unexamined Published Japanese Patent Application No. Hei-6-54396 has proposed a method for controlling a threshold voltage of MOS transistors by setting a variable substrate bias.

The substrate bias is set to the power source potential for PMOS (P-channel MOS transistors) and the ground potential for NMOS (N-channel MOS transistors) in the active state when the object CMOS circuit is required for a fast operation. On the other hand, in the standby state in which the CMOS is not required for any fast operation, the substrate bias is set to a potential higher than the supply voltage for PMOS and lower than the supply voltage for NMOS (hereafter, this operation will often be referred to as "applying a bias voltage to a substrate").

With such a setting of a substrate bias voltage in the standby state, it becomes possible to raise the threshold level of the MOS transistors composing the object CMOS circuit, thereby reducing the static power consumption caused by a subthreshold leakage current.

DISCLOSURE OF INVENTION

In order to materialize a semiconductor IC unit such as a microprocessor, etc., which can satisfy both fast operation and lower power consumption properties, the substrate bias must be controlled as described above for each CMOS circuit so that the threshold voltage of the MOS transistors is lowered when the semiconductor IC unit is active and raised when the semiconductor IC unit stands by, thereby reducing the subthreshold leakage current.

As a result of examination, however, the present inventor has found that the following problems still remain unsolved when in controlling the substrate bias in an actual semiconductor IC unit.

(1) A substrate bias controlling circuit must be tested easily as ever.

(2) A CMOS circuit must be prevented from malfunction by controlling the substrate bias.

(3) An increase of a circuit area must be minimized by controlling the substrate bias.

(4) A semiconductor IC unit must be prevented from malfunction when the substrate bias is switched over.

In order to solve the above problems, the present invention has proposed the following means mainly.

To make it easier to test the substrate bias controlling circuit, the output of the negative voltage generating circuit is connected to a pad. In other words, the negative voltage generating circuit must be checked for if a preset voltage level is reached as its output signal. For this check, the negative voltage generating circuit should be provided with a terminal from which the signal is output as it is.

In order to lower the substrate impedance, a plurality of substrate MOS transistors are provided in the main circuit used for controlling the substrate bias. The substrate driving MOS transistors are used to drive the substrate bias when the semiconductor IC unit is active. This is because the impedance must be lowered to fix the substrate potential and suppress the variance of the transistor threshold level when the IC circuit is active, thereby enabling the respective circuits in the main circuit to operate.

The driving power of the semiconductor IC unit increases in the active state more than in the standby state. Preferably, the driving power should thus be 5 times. Ideally, it should be 10 times that in the standby state.

Usually, each circuit becomes unstable when the substrate bias is switched over. In order to prevent this, the gate control signal used for controlling the gate voltage of a substrate driving MOS transistor is wired so that the control signal, after being connected to the substrate driving MOS transistor, is returned to the substrate bias controlling circuit and the potential of the returned signal is used by the substrate bias controlling circuit to detect that the main circuit substrate bias is stabilized.

The semiconductor IC unit is provided with a power-on resetting circuit. The power-on resetting circuit detects that the main circuit is powered. The semiconductor IC unit is kept in the active state so that each substrate driving MOS transistor drives the substrate bias shallowly for a fixed time after the main circuit is powered.

While the semiconductor IC unit is shifted from the standby state to the active state, the substrate bias controlling circuit controls the output impedance of the gate control signal so as to become larger than the impedance to be set after the semiconductor IC unit enters the active state completely.

The semiconductor IC unit is also provided with a negative voltage generating circuit. The substrate bias controlling circuit controls the output impedance of the negative voltage generating circuit in the standby state so as to be smaller than the output impedance in the active state.

The main circuit comprises a plurality of cells. Those cells compose a power-supply net, which is powered by the first metal levels. Another power-supply net is formed with the second wiring layers, which are orthogonal to the first metal levels. And, a switch cell is disposed at each intersection point of the power-supply nets formed with the first and second wiring layers. The power-supply nets of the first and second wiring layers are connected to each other in the switch cells. A substrate driving MOS transistor described above is disposed in each of those switch cells.

The substrate bias supply line of a MOS transistor composing one of the above cells is formed with the first metal levels, which are in parallel to the power-supply net formed with the first metal levels, as well as by the second wiring layers in parallel to the power-supply net formed with the second wiring layers. In the same way as those power-supply nets, the substrate bias supply line formed with the first metal levels is connected to the substrate bias supply line formed with the second wiring layers in each of the switch cells, thereby the gate control signal for controlling the gate voltage of each substrate drive MOS transistor is supplied by the second wiring layers above the switch cell, in parallel to the power-supply net formed by the second wiring layers. The gate control signal is then connected to the gate terminal of the substrate drive MOS transistor in a switch cell described above.

More concretely, the semiconductor IC unit of the present invention comprises a main circuit composed of at least one transistor; a substrate bias controlling circuit used for controlling a voltage to be applied to each transistor substrate; and a standby controlling circuit used for switching between at least two states; active and standby. In the active state, the substrate bias controlling circuit is controlled to increase the subthreshold leakage current flowing in the main circuit. In the standby state, the bias controlling circuit is controlled to decrease the subthreshold leakage current. The semiconductor IC circuit is also provided with a negative voltage generating circuit, which is incorporated in the substrate bias controlling circuit, as well as a terminal for outputting a negative voltage generated from the negative voltage generating circuit to external.

At this time, the semiconductor IC unit is provided with a semiconductor chip having output pads, and a package incorporating the semiconductor chip in itself and having external pins, wherein one of the output pads is used as a terminal, which is not connected to any external pin.

In another embodiment, the semiconductor IC unit is provided with a main circuit composed of at least one MOS transistor, a substrate bias controlling circuit used for controlling a voltage applied to the substrate of the MOS transistor, a standby controlling circuit used for switching the semiconductor IC unit between at least two states of active and standby. The active state allows much subthreshold leakage current to flow in the main circuit and the standby state allows less subthreshold leakage current to flow in the main circuit. The semiconductor IC unit thus controls the substrate bias shallowly in the active state and deeply in the standby state, so that the power for driving the substrate bias shallowly in the active state becomes 10 times or over larger than the power for driving the substrate bias deeply in the standby state.

When the substrate bias is controlled deeply, it should preferably be avoided to operate the main circuit composed of transistors whose substrate is applied a bias voltage respectively. When a bias voltage is applied to the substrate of a transistor, the substrate impedance is high. If a MOS transistor is activated, therefore, the substrate potential is easily changed. Consequently, the MOS transistor will probably malfunction in such a case.

In this embodiment, at least two MOS transistors are used for driving the substrate bias shallowly in the active state. Those MOS transistors are disposed at a distance of 20 $\mu$m or over from each other. The gate potential of each of the substrate driving MOS transistors is controlled by the substrate bias controlling circuit.

The gate control signal used for controlling the gate voltage of the substrate driving MOS transistors is returned to the substrate bias controlling circuit after it is connected to the gate of each of the substrate driving MOS transistors. After this, according to the potential of the returned signal, the substrate bias controlling circuit can detect that the substrate bias applied to the main circuit is stabilized.

Preferably, the threshold voltage of the substrate driving MOS transistors should be set larger than the threshold level of the MOS transistors composing the main circuit. If the semiconductor IC unit is provided with an I/O circuit used for interfacing with external, at least one of the MOS transistors composing the I/O circuit should preferably be coated with an oxidization film thicker than the oxidization film of the MOS transistors composing the main circuit. Such way, the withstand voltage should preferably be set high at portions to which a high voltage is applied.

The semiconductor IC unit is further provided with a power-on resetting circuit used for detecting that the main circuit is powered. The active state is kept for a fixed time after the main circuit is powered. In the active state, each substrate MOS transistor drives the substrate bias shallowly.

In another embodiment of the present invention, the semiconductor IC unit is provided with two supply voltages; the first (VDDQ) and the second (VDD). The first supply voltage has its absolute value larger than that of the second supply voltage, which is 2V or under. The second supply voltage (VDD) is supplied to the main circuit (LOG) and the first supply voltage (VDDQ) is supplied to both substrate bias controlling circuit (VBC) and standby controlling circuit (VBCC). The first supply voltage is applied earlier than the second supply voltage. The substrate bias controlling circuit controls so as to keep the main circuit in the active state for a fixed time after the substrate bias controlling circuit is applied the second supply voltage.

Furthermore, if the output impedance of the gate control signal of the substrate driving MOS transistors in a process in which the state is shifted from standby to active is set higher than that after the state is already set in the active state, it becomes possible to adjust the speed for shifting the state from standby to active so as to suppress the inrush current low in the shifting-process.

Furthermore, if the output impedance of the gate control signal of the substrate driving MOS transistors in a process in which the state is shifted from standby to active is set higher than that after the state is already set in the active state, it becomes possible to adjust the speed for shifting the state from standby to active so as to suppress the inrush current low in the shifting process. It also becomes possible to detect by the returned signal that the main circuit is already set in the active state.

It is also possible to set the amplitude of the gate control signal larger than the gate breakdown voltage of the substrate driving transistors.

Furthermore, the semiconductor IC unit is provided with a negative voltage generating circuit, so that the substrate bias controlling circuit can control the output impedance of the negative voltage generating circuit in the standby state lower than that in the active state.

Another embodiment of the present invention is a semiconductor IC unit in accordance with claim 13, wherein the negative voltage generating circuit is provided with the first and second charging pump circuits, so that the substrate bias controlling circuit uses the first charging pump circuit in the standby state and the second charging pump circuit in the active state thereby to generate a negative voltage respectively. In addition, the pumping capacitor of the first charging pump is set smaller than that of the second charging pump circuit.

The semiconductor IC unit may also be composed so that the negative voltage generating circuit can generate the third supply voltage in addition to the first and second supply voltages so that the first supply voltage is larger than the second supply voltage, which is 2V or under, and the main circuit is supplied the second supply voltage while the substrate bias controlling circuit and the standby controlling circuit are supplied at least the first supply voltage and the substrate bias controlling circuit controls the substrate bias of PMOS transistors so as to be adjusted to the second supply voltage potential in the standby state and the substrate bias of NMOS transistors so as to be adjusted to the third supply voltage potential thereby to satisfy (the third supply voltage)=(the first supply voltage)−(the second supply voltage).

Furthermore, the negative voltage generating circuit is provided with at least a charging pump circuit, a comparator, the first reference voltage circuit used for generating a potential of a half of the second supply voltage one, and the second reference voltage circuit used for generating an intermediate potential between the first and third supply voltages. The comparator compares the voltage output from the first reference voltage circuit with the voltage output from the second reference voltage generating circuit thereby controlling at least one of the charging pumps to stabilize the third supply voltage.

The first and second reference voltage generating circuits are composed respectively of a serial circuit in which same type conductor MOS transistors are connected serially. In each of the conductor MOS transistors, the substrate terminal is connected to the source terminal and the gate terminal is connected to the drain terminal. Each of the first and second reference voltage generating circuits can be selected so as to operate a plurality of MOS transistors in a saturation area. It may also be composed so as to have Schmitt characteristics.

The main circuit is composed of a plurality of cells. A power-supply net for those cells is powered by the first metal levels. Another power-supply net is formed with the second wiring layer above those first metal levels so as to be orthogonal to those first metal levels. And, a switch cell is disposed at each intersection point of the power-supply nets formed with the first and second wiring layers, so that both power-supply nets formed with the first and second wiring layers are connected to each other in such the switch cells. In addition, a substrate driving MOS transistor is disposed in each of those switch cells.

A switch cell may also be composed so as to dispose a decoupling capacitor between a power source and a ground.

In addition, above the power-supply net formed with the second wiring layers is disposed a power-supply net formed with the fourth wiring layers, which are in parallel to the power-supply net formed with the second wiring layers. The power-supply nets formed with the second and fourth wiring layers may be connected to each other outside those switch cells.

There is another power-supply net formed with the fifth wiring layers. The power-supply net is connected to the power-supply net formed with the fourth wiring layers in switch cells. A power source mesh formed with the power-supply nets of the fourth and fifth wiring layers may be rougher than the power source mesh formed with the power-supply nets formed with the first and second wiring layers. And, the fourth and fifth wiring layers may be thicker than any of the first and second wiring layers.

The substrate bias supply lines of the MOS transistors composing cells respectively may be formed with the first metal levels in parallel to the power-supply net formed with the first metal levels, as well as in parallel to the power-supply net formed with the second wiring layers. Just like the power-supply nets described above, the substrate bias supply lines formed with the first metal levels may be connected to the substrate bias supply lines formed with the second wiring layers in switch cells.

The gate control signal used for controlling the gate voltage of each of the substrate driving MOS transistors may be supplied by the second wiring layers formed above switch cells, which are disposed in parallel to the power-supply net formed with the second wiring layers and connected to the gate terminal of each of the substrate driving MOS transistors in a switch cell.

The substrate bias supply lines wired by the second wiring layers above the switch cells and the gate control may be disposed between the power-supply nets wired by the second wiring layers above switch cells.

The semiconductor IC unit of the present invention is also provided with a data path circuit. The data flowing direction of the data path circuit may be in parallel to the power-supply net wired by the first metal levels used for a plurality of cells.

The substrate bias can be set so as to raise the threshold level of at least one MOS transistor when the semiconductor IC unit of the present invention is selected.

In another embodiment of the present invention, in a charging pump circuit composed of the first and second pumping capacitors, the first and second (two) P-channel transistors, the first and second (two) N-channel transistors, and an oscillating circuit, the first pumping capacitor, the first P-channel transistor, and the first N-channel transistor are used for pumping the electric charge of the first pumping capacitor when the output of the oscillating circuit is 'H' and the second pumping capacitor, the second P-channel transistor, and the second N-channel transistor are used for pumping the electric charge of the second pumping capacitor when the output of the oscillating circuit is 'L'.

In further another embodiment of the present invention, the semiconductor IC unit is provided with a main circuit (LOG) including transistors composed on a semiconductor substrate respectively and a substrate bias controlling circuit (VBC) used for controlling a voltage to be applied to each substrate. The main circuit is provided with switch transistors (MN1 and MP1) used for controlling a voltage to be applied to each substrate and receives control signals output from the substrate bias controlling circuit through the gate of each of the switch transistors. The control signals may be composed so as to be returned to the substrate bias controlling circuit.

Each switch transistor is disposed in a rectangular switch cell and each of other transistors is disposed in a rectangular standard cell. A switch cell and a standard cell should preferably be disposed side by side in terms of the layout.

The power sources (VSS and VDD) used for driving the transistors (MN2 and MP2) in the main circuit, as well as the power sources (vbp and vbn) of the substrate bias supplied from the substrate bias controlling circuit should preferably be wired so as to cross both switch cells and standard cells vertically in the direction those cells are disposed.

The threshold level of the switch transistors should preferably be larger than that of other transistors in terms of the transistor resistance.

The switch transistors (MN1 and MP1) should preferably be inserted between the driving power sources (VSS and VDD) for the transistors in the main circuit and the power sources (vbp and vbn) of the substrate bias supplied from the substrate bias controlling circuit in terms of the layout.

The source or drain of each transistor can be connected to the driving power sources (VSS and VDD) and the transistor substrate potential can be connected to the substrate bias power sources (vbp and vbn).

The substrate bias controlling circuit can detect that control signals (vbp and vbn), after they are output, have been returned via the main circuit as control signals (vbpr and vbnr), then have reached a predetermined voltage. Then, the substrate bias controlling circuit can generate a detection signal (vbbenbr), thereby stabilizing the operation of the main circuit.

BEST MODE FOR CARRYING OUT THE INVENTION

Figure 1:
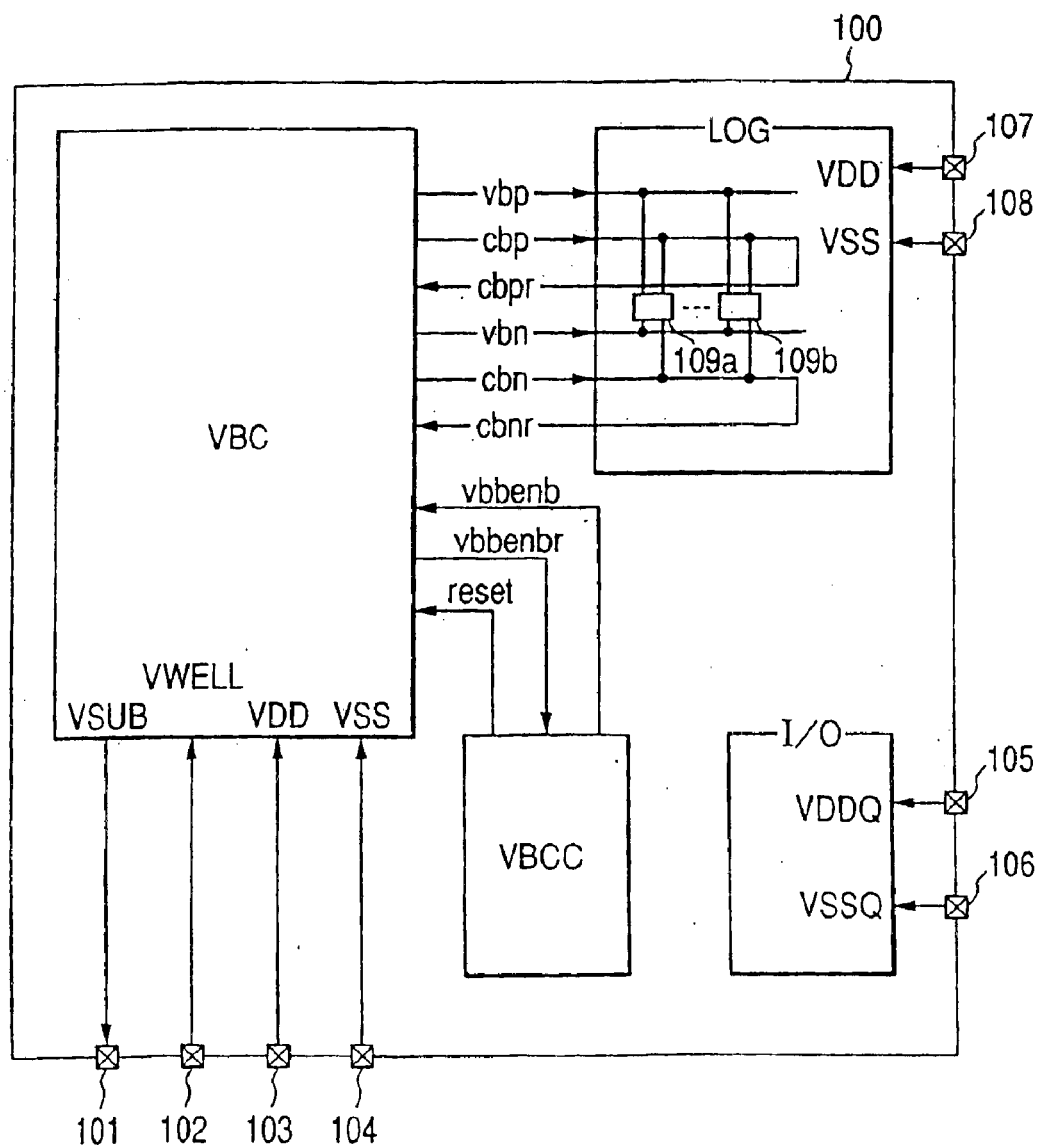
FIG. 1 is a block diagram of a semiconductor IC unit of the present invention.

FIG. 1 shows a block diagram of a semiconductor IC unit 100 that uses a substrate bias controlling circuit of the present invention. VBC is a substrate bias controlling circuit. LOG is the main circuit whose substrate bias is controlled. The LOG is composed of logic circuits and memory circuits. VBCC is a standby controlling circuit used to control the substrate bias controlling circuit. I/O is an I/O circuit used to interface between the semiconductor IC unit 100 and external. Wirings between circuit blocks, which are not needed specially for substrate controlling, are omitted here. 109a and 109b are substrate driving circuits.

The semiconductor IC unit is provided with three types of power sources indicated as VDDQ, VDD, and VWELL. VSS and VSSQ are ground potentials used for VDD and VDDQ. VDDQ and VSSQ are power sources used for the I/O circuit. VDD and VSS are power sources used for the main circuit. VWELL is a power source used for the substrate bias controlling circuit VBC.

As shown in FIG. 1, VDD and VSS are also supplied to the substrate bias controlling circuit VBC. The substrate bias controlling circuit VBC incorporates a negative voltage generating circuit in it, generating a negative voltage VSUB which is inverse in polarity from VDDQ. In this embodiment, the levels of these supply voltages are assumed as follows; VDDQ=VWELL=3.3V and VDD=1.8V, and VSUB=−1.5V.

101, 102, 103, and 104 are pads of the semiconductor IC unit. The pad 102 is supplied 3.3V from VWELL, the pad 103 is supplied 1.8V from VDD, and the pad 104 is supplied 0V from VSS (ground) respectively. 101 is a VSUB pad, but it is used to output a negative voltage generated from inside the substrate bias controlling circuit. The voltage of the pad 101 can be monitored to detect errors of the negative voltage generating circuit provided in the substrate bias controlling circuit VBC when in a wafer test of the semiconductor IC unit 100. Usually, pads 102 to 104 are bonded to external pins of the semiconductor IC unit 100, but the pad 101 is not bonded to any outer pin. With this testing method, the number of external pins can be saved.

vbbenb is a signal used for starting substrate bias controlling and vbbenbr is a signal indicating that the substrate bias is now being controlled. On the other hand, reset is a RESET signal connected to the RESET signal of the semiconductor IC unit. vbp is a PMOS substrate bias line, vbn is an NMOS substrate bias line, cbp is a PMOS substrate control line, cbn is an NMOS substrate control line, cbpr is a PMOS substrate control return line, and cbnr is an NMOS substrate control return line. The substrate control return lines cbpr and cbnr are used for signals returned after both cbp and cbn signals pass through the main circuit. The same net is used for both of the return lines cbpr and cbnr. In other words, both drive voltages cbp and cbn appear in cbpr and cbnr after a delay. (See FIG. 2 to be shown later.) To each of the substrate driving circuits 109a and 109b are connected cbp, vbp, cbn, and vbn respectively.

Figure 2:
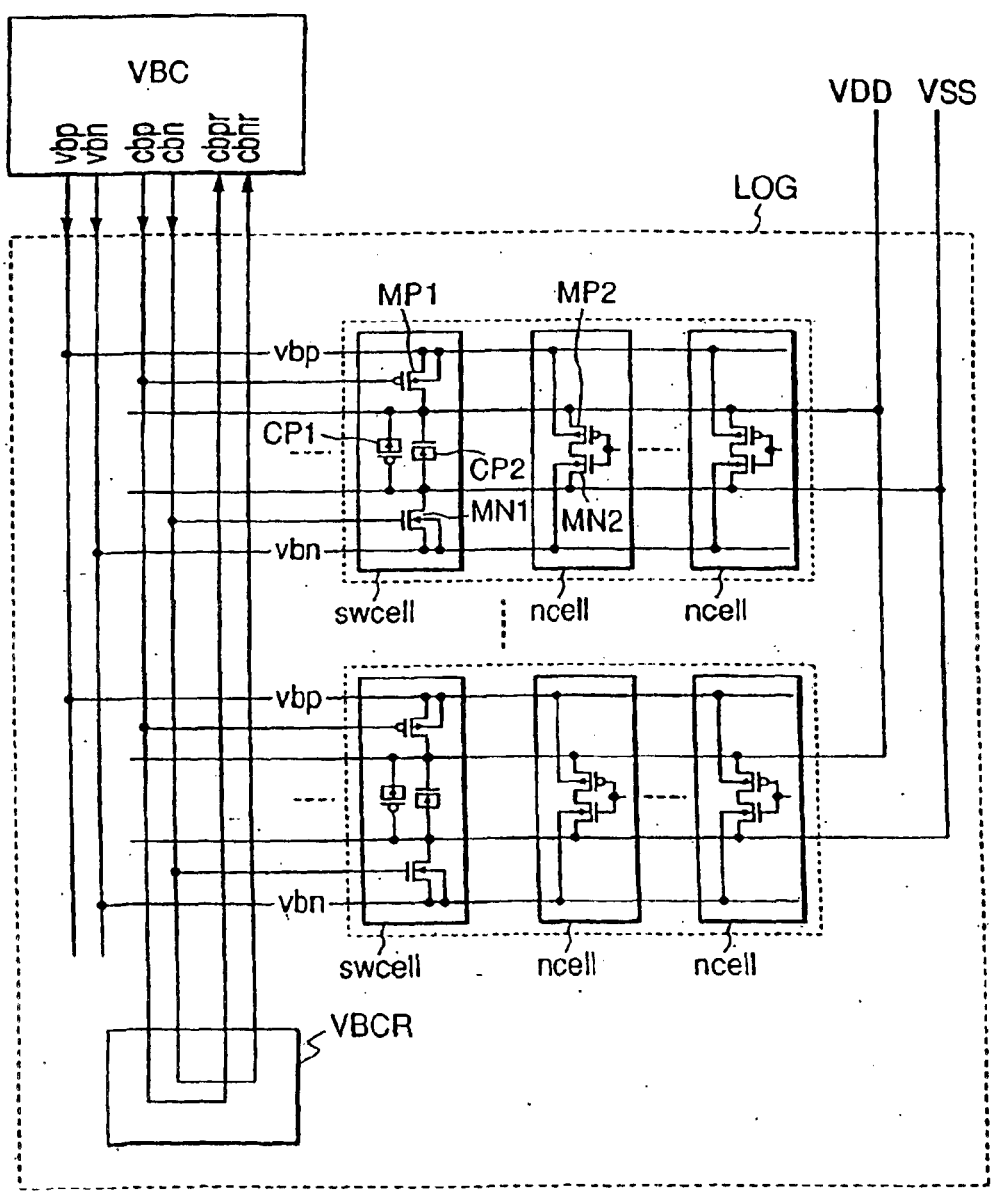
FIG. 2 is a detailed circuit diagram of a main circuit.

FIG. 2 shows how 6 substrate bias control lines (vbp to cbnr) are connected in the main circuit LOG. VBCR is a return cell. In this VBCR, the PMOS substrate control line cbp is connected to the PMOS substrate control return line cbpr, as well as the NMOS substrate control line cbn is connected to the NMOS substrate control return line cbnr.

ncell is a standard cell. In this embodiment, every ncell is shown as a CMOS inverter composed of PMOS MP2 and NMOS MN2 to simplify the description. Of course, every ncell may be more complicated in structure like a cell composed of a NAND gate, a latch, etc. independently of others. The substrate potential of each MOS transistor is connected to vbp for PMOS and vbn for NMOS respectively. Those MOS transistors are composing an ncell respectively as shown in FIG. 2.

swcell is a switch cell composed of substrate driving circuits (equivalent to 109a and 109b shown in FIG. 1) composed of PMOS MP1 and NMOS MN1, as well as decoupling capacitors CP1 and CP2 respectively. In the MP1, the gate is connected to cbp, the drain is connected to VBP, and the source is connected to VDD. Consequently, when the cbp voltage is lower than VDD-Vthp (Vthp: an absolute value of the MP1 threshold voltage), MP1 is activated and vbp is driven into the VDD potential (1.8V).

On the other hand, the gate, drain, and source of the MN1 are connected to cbn, VBN, and VSS (0V) respectively. Consequently, when the cbn voltage is higher than Vthn (Vthn: an absolute value of the MN1 threshold voltage), the MN1 is activated and the vbn is driven into the VSS potential (0V).

Generally, ncell is disposed more than one. So does swcell. The number of ncells can be increased to integrate complicated circuits in the main circuit LOG. The number of swcells can also be increased to drive the MP1 and MN1 into a lower impedance respectively when they are activated, as well as vbp and vbn can be driven into VDD and VSS.

In addition to the decoupling capacitor incorporated in a switch cell swcell, another decoupling capacitor can also be incorporated in a space cell independently of the above one. A space cell means a cell inserted in a space reserved for a wiring area, for example, when standard cells are to be disposed side by side. If a decoupling capacitor is incorporated in such a space cell, the total capacity of the decoupling capacitors on the whole chip is increased, thereby reducing the power source noise more significantly. Since a space cell is a free space provided just in a wiring layer originally, the space is not increased even when a capacitor is inserted there.

Both MP1 and MN1 in a swcell must be set to a threshold value higher than that of a MOS transistor in an ncell. The reason is as follows; although the MOS transistor substrate potential (connected to vbp or vbn) in an ncell is independent of the source potential, the substrate potentials of both MP1 and MN1 in the swcell are always the same as the drain potential, thereby no substrate bias effect is expected. A subthreshold leakage current thus flows in the semiconductor IC unit.

For example, if it is assumed that vbp=3.3V, vbn=−1.5V, VDD=1.8V, and VSS=0V are set for NMOS transistors MN1 and MN2 respectively, the source potential S, drain potential D, and substrate potential B of the MN2 in the ncell become S=0.0V, D=1.8V, and B=−1.5V. Consequently, the threshold voltage of the MN2 rises due to the substrate bias effect, thereby the subthreshold leakage current is reduced. On the contrary, the source potential S, drain potential D, and substrate potential B of the MN1 in swcell becomes S=0.0V, D=−1.5V, and B=−1.5V. Consequently, the substrate bias effect does not work to change the threshold voltage. A large subthreshold leakage current thus flows between VSS and vbn in the MN1.

There are some methods for setting the threshold voltage levels of both MP1 and MN1 in the swcell higher than those of the MOS transistors in the ncell. For example, the concentration of impurity under gate, the gate length (L), or the gate oxidization film thickness is changed. There is no restriction for those methods, but it is assumed in this embodiment that the gate length L and the gate oxidization film thickness are changed to obtain a high threshold voltage of both MP1 and NM1. With any of those methods, high voltage MOS transistors can be used for the input/output circuit (hereafter, to be referred to as an I/O circuit) to/from an external part of the microcomputer.

Figure 3:
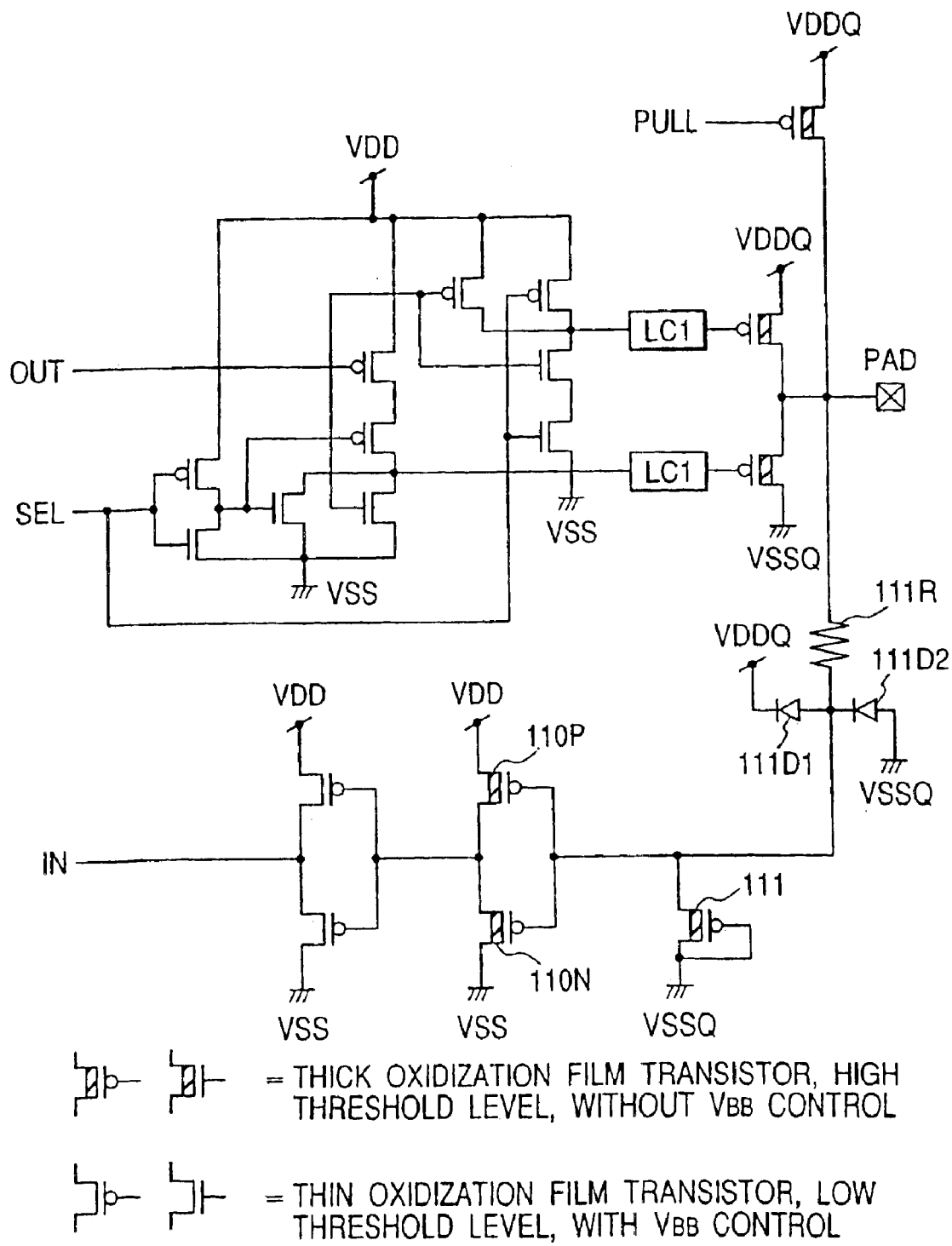
FIG. 3 is a circuit diagram of an I/O circuit.

FIG. 3 shows an embodiment for the I/O circuit. In FIG. 3, only one bit part of the I/O circuit is shown. The I/O circuit inputs and outputs signals to and from the chip via an input/output terminal PAD. If SEL is 'L', the PAD functions as an input terminal. If SEL is 'H', the PAD functions as an output terminal. LC1 is a level converting circuit used to convert a VDD amplitude signal to a VDDQ amplitude signal. The VDDQ amplitude is larger than the VDD amplitude. Consequently, a thick oxidization film transistor is provided between the level converting cell LC1 and the input/output terminal PAD. The thick oxidization film transistor is driven by VDDQ. In this embodiment, SEL is set to 'L' thereby to pull up the PULL using a PMOS pull-up transistor. This is done only when the PULL must be pulled up. The PMOS is also a thick oxidization film transistor.

At the input side, a VDDQ amplitude signal, entered from external, is converted to a VDD amplitude signal using an inverter composed of 110P and 110N. Consequently, these two transistors handle signals whose levels are not changed yet. Thus, they must be thick oxidization film transistors. A resistor 111R, diodes 111D1 and 111D2, and a transistor 111 are input protecting circuits. The diodes 111D1, 111D2 may be MOS transistors. The transistors in each of these input protecting circuits are thick oxidization film transistors.

A higher threshold level voltage can thus be set for thick oxidization film transistors described above, since the transistors do not require so fast switching speed and handle a voltage higher than the VDD. The threshold level voltage can be set higher than that of the transistors used for ncell. Consequently, it is possible to suppress the subthreshold current low when such a thick oxidization film transistor is off. Such thick oxidization film transistors can be used for MP1 and MN1 composing a switch swcell shown in FIG. 2 respectively. No additional complicated process is needed for MP1 and MN1.

Figure 4:
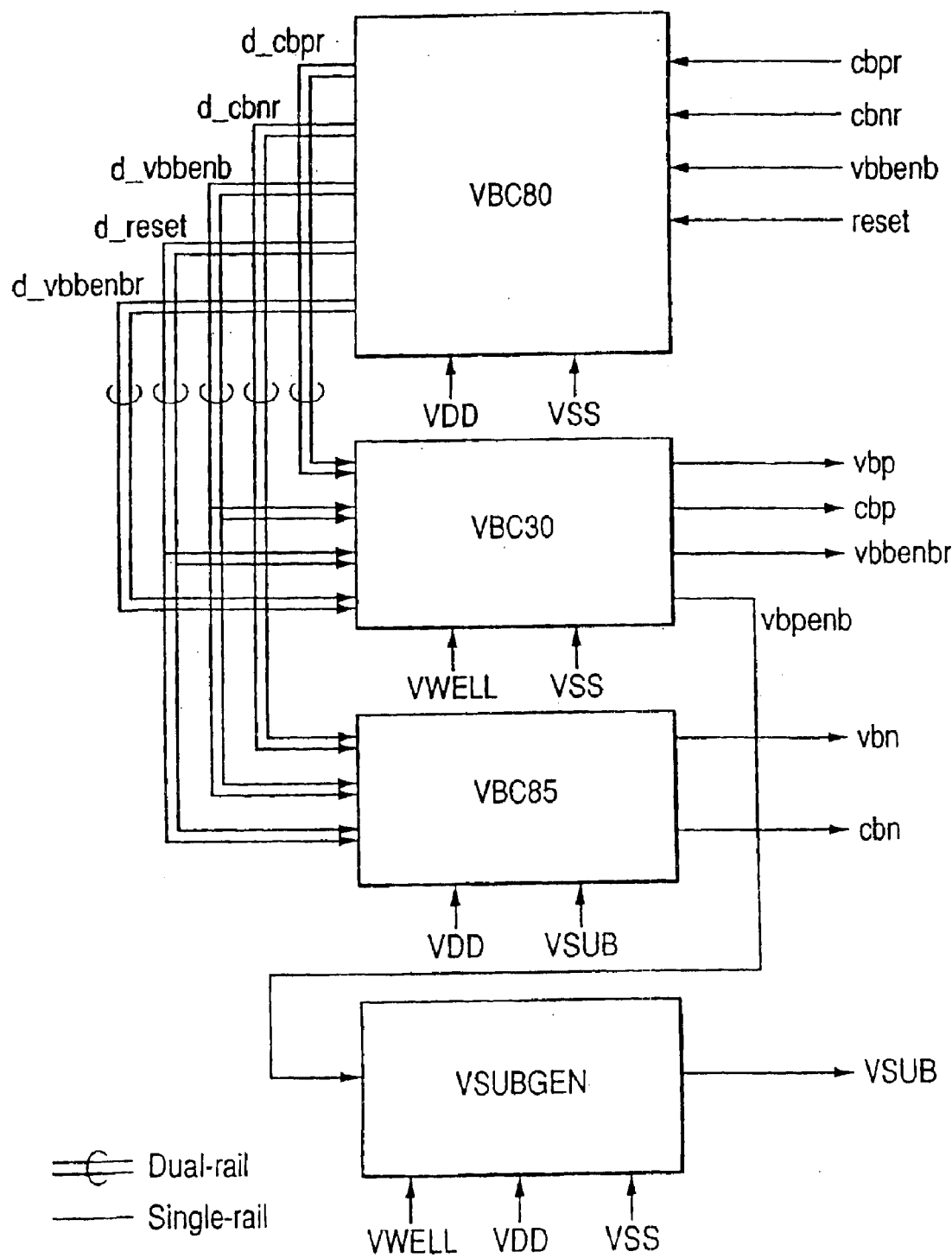
FIG. 4 is a block diagram of each circuit provided in a substrate bias controlling circuit.

FIG. 4 shows an internal configuration of the substrate bias controlling circuit VBC. This controlling circuit comprises 4 circuit blocks. VBC 80 is supplied powers VDD and VSS, VBC 30 is supplied powers VWELL and VSS, VBC 85 is supplied powers VDD and VSUB and VSUBGEN is supplied VWELL, VDD, and VSS.

Consequently, the supply voltage applied to the circuits in VBC 30, VBC 85, and VSUBGEN is 3.3V at most. If VDDQ=VWELL is satisfied, however, the powers supplied to the I/O circuit are VDDQ and VSSQ, the total of which becomes 3.3V. Consequently, the I/O circuit and the substrate bias controlling circuit can share their devices.

On the other hand, the VBC 80 is powered by 1.8V. Consequently, the signal lines from VBC 80 to VBC 30 and VBC 85 use a dual rail signal (a balance signal paired by a positive logic signal and a negative logic signal) respectively. Each signal level is changed (converting a 1.8V amplitude signal to a 3.3V amplitude signal) in both VBC 30 and VBC 85.

The VBC 80 is an interface circuit block used for interfacing between signals cbpr, cbnr, vbbenb, and reset entered from an external part of the substrate bias controlling circuit and VBC 30 and/or VBC 85. The VBC 30 is a circuit block for controlling the PMOS substrate bias, the VBC 85 is a circuit block for controlling the NMOS substrate bias and the VSUBGEN is a negative voltage generating circuit block.

Figure 5:
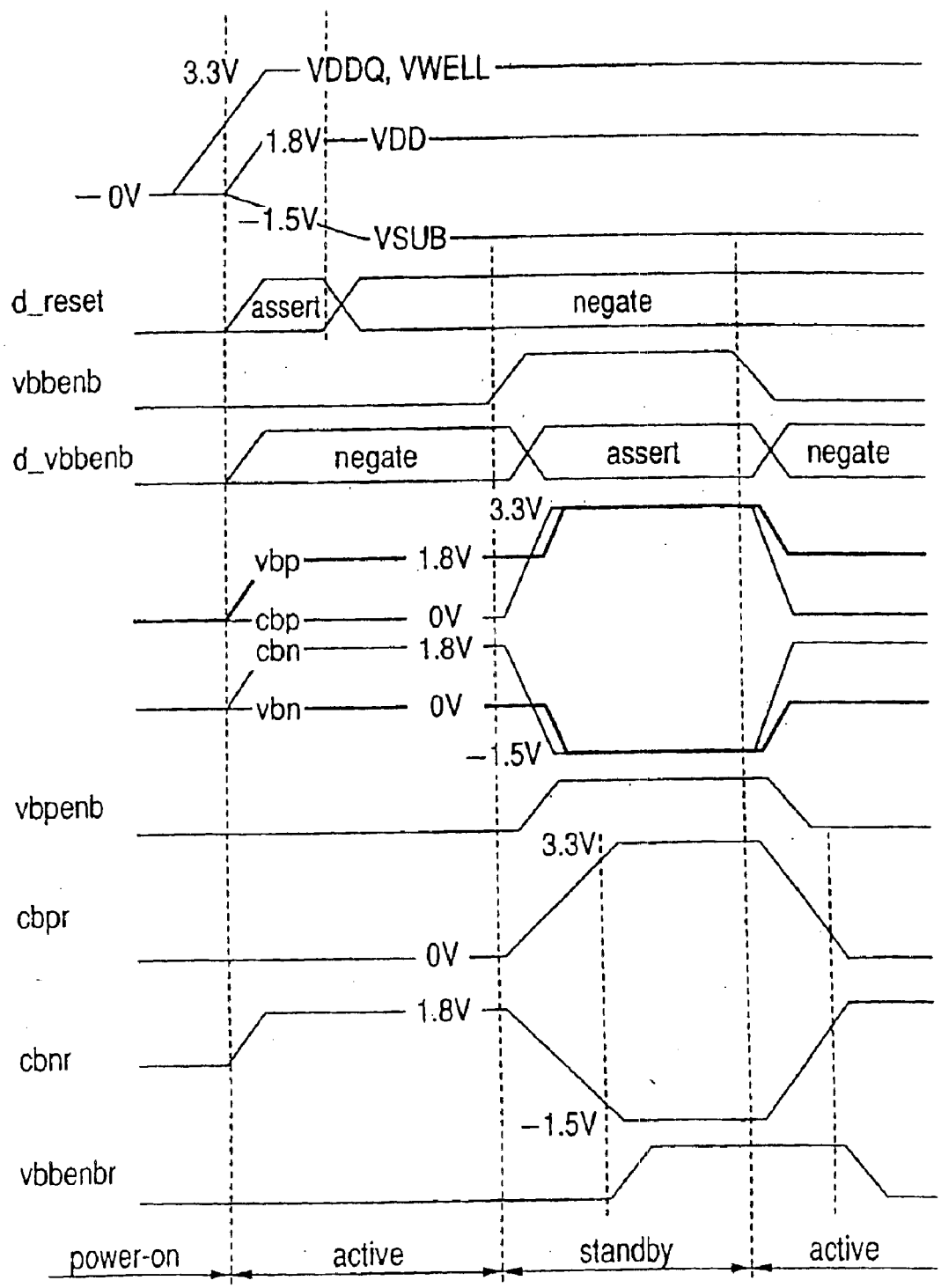
FIG. 5 is operation waveforms of the substrate bias controlling circuit.

FIG. 5 shows examples of operation waveforms. The main circuit power VDD is activated after the I/O circuit power VDDQ and the substrate bias controlling circuit VBC power VWELL are activated. Consequently, the negative voltage generating circuit block VSUBGEN is started thereby to generate the negative voltage VSUB. On the other hand, if the power VDD is activated, the d_reset signal is asserted for a fixed time. And, if this signal is asserted such way, the substrate bias controlling circuit transfers to the state with the highest priority in which the substrate biases of the main circuit are not applied. In other word, the substrate bias controlling circuit transfers to the active state. (Applying a bias voltage to a substrate such way means changing the substrate bias to the VDD potential for PMOS and to the VSS potential for NMOS. And, not applying a bias voltage to a substrate means changing the substrate bias to a potential higher than the VDD potential for PMOS and a potential lower than the VSS potential for NMOS.)

In this active state, vbp=1.8V, vbn=0V, cbp=0V, cbn=1.8V are set for the PMOS substrate bias line, the NMOS substrate bias line, the PMOS substrate control line, and the NMOS substrate control line respectively. Since the substrate control return lines cbpr and cbnr are used for return signals of cbp and cbn, cbpr=cbp=0V and cbnr=cbn=1.8V is satisfied.

If the d_reset signal is negated with a fixed time passed after the VDD is activated, the substrate bias is controlled by the vbbenb signal. If the vbbenb signal is 3.3V, the standby state is set so that a bias voltage is applied to the object substrate. If the vbbenb signal is 0V, the active state is set so that no bias voltage is applied to the object substrate.

In other words, if the level of the vbbenb signal is shifted from 0V to 3.3V, the state is shifted so that vbp=cbp=3.3V and vbn=cbn=−1.5V are satisfied. After this, the state is shifted so that cbpr=cbp=3.3V and cbnr=cbn=−1.5V is satisfied. The vbbenbr signal is then shifted to 3.3V when cbpr=3.3V and cbnr=0V are satisfied. Consequently, if the level of the vbbenb signal is shifted from 0V to 3.3V, the signal is set to 3.3V after a certain time (after the return signals cbpr and cbnr of the cbp or cbn is returned).

If the vbbenb signal is shifted to 0V from 3.3V in level, other signals are also shifted in level as follows; vbp=1.8V, cbp=0V, vbn=0V, and cbn=1.8V. Then, those other signals are shifted in level as follows a certain time later; cbpr=cbp=0V, cbnr=cbn=1.8V, and vbbenbr=0V. The vbbenbr functions as a return signal of the vbbenb such way. Furthermore, as shown in FIG. 2, since the substrate potential is decided by the potentials of both cbp and cbn, it is also possible to detect the substrate potential state by monitoring the vbbenbr obtained from the potentials of both cbp and cbn.

Figure 6:
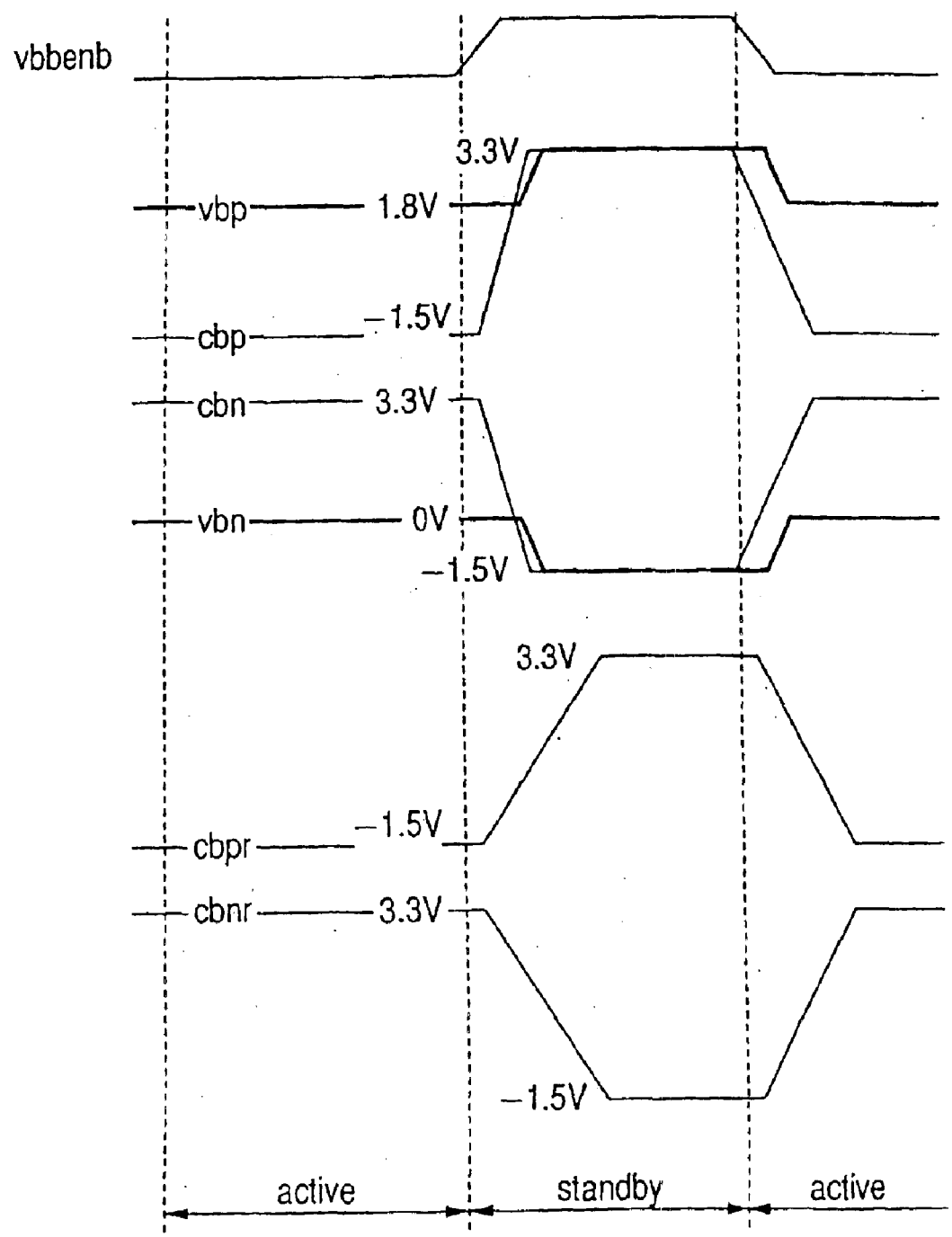
FIG. 6 is operation waveforms of the substrate bias controlling circuit in another embodiment of the present invention.

FIG. 6 shows operation waveforms of the substrate bias controlling circuit in another embodiment, all of which are different from those shown in FIG. 5. As shown in FIG. 6, when the cbp and the cbn are controlled, the controlling circuit becomes complicated a little more in configuration, but such a complicated controlling circuit enables a larger voltage to be applied to both source and gate terminals of the MP1 and MN2 shown in FIG. 2 respectively in the active state. Both vbp and vbn can thus be driven into a lower impedance. In this case, the cbp and the cbn equivalent to the gate control signal becomes larger in amplitude than the gate breakdown voltage of the substrate driving transistors MP1 and MN1. However, as shown in FIG. 6, if both cbp and cbn are changed in level slowly, the voltages between the gate and drain terminals, as well as between the gate and source terminals of both MP1 and MN1 become 3.3V at highest, which is equal to the gate breakdown voltage or under.

Hereunder, a detailed circuit diagram of each circuit block will be described. In order to simplify the description, each of the circuit blocks will be assumed as a circuit generating the waveform shown in FIG. 4.

Figure 7:
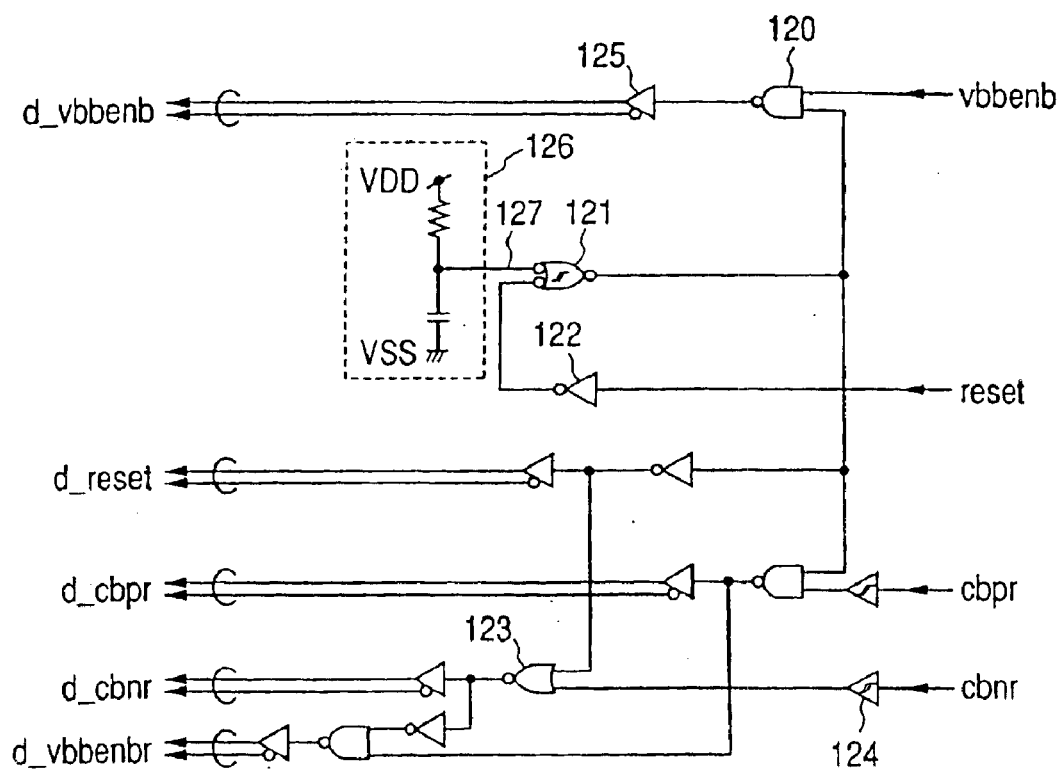
FIG. 7 is a circuit diagram of a VBC 80.

FIG. 7 shows a circuit diagram of the VBC 80. Numeral 120 is a 2-input NAND, 121 is a 2-input AND provided with Schmitt characteristics, 122 is an inverter, 123 is a NOR, 124 is a buffer provided with Schmitt characteristics, and 125 is a buffer provided with a differential output. 126 is a power-on resetting circuit, whose output 127 is charged to 1.8V from 0V step by step after the power source VDD is activated. Consequently, the 2-input AND 121 outputs 0V for a fixed time, then outputs 1.8V. The d_reset signal is thus asserted by this output for a fixed time as shown in FIG. 5 when the power source VDD is activated. Although the power-on resetting circuit 126 shown in FIG. 7 is simply composed of resistors and capacitors, the circuit 126 can also be composed in another way if it is possible to detect stabilized power source VDD.

The signals d_vbbenb, d_cbpr, and d_cbnr are obtained by converting the signals vbbenb, cbpr, and cbnr to dual rail signals respectively. Those dual rail signals are used to activate the substrate controlling when the power-on state is reset. The d_vbbenbr, which is a dual rail signal used to generate the vbbenbr shown in FIG. 5, is generated from cbpr and cbnr.

Figure 8:
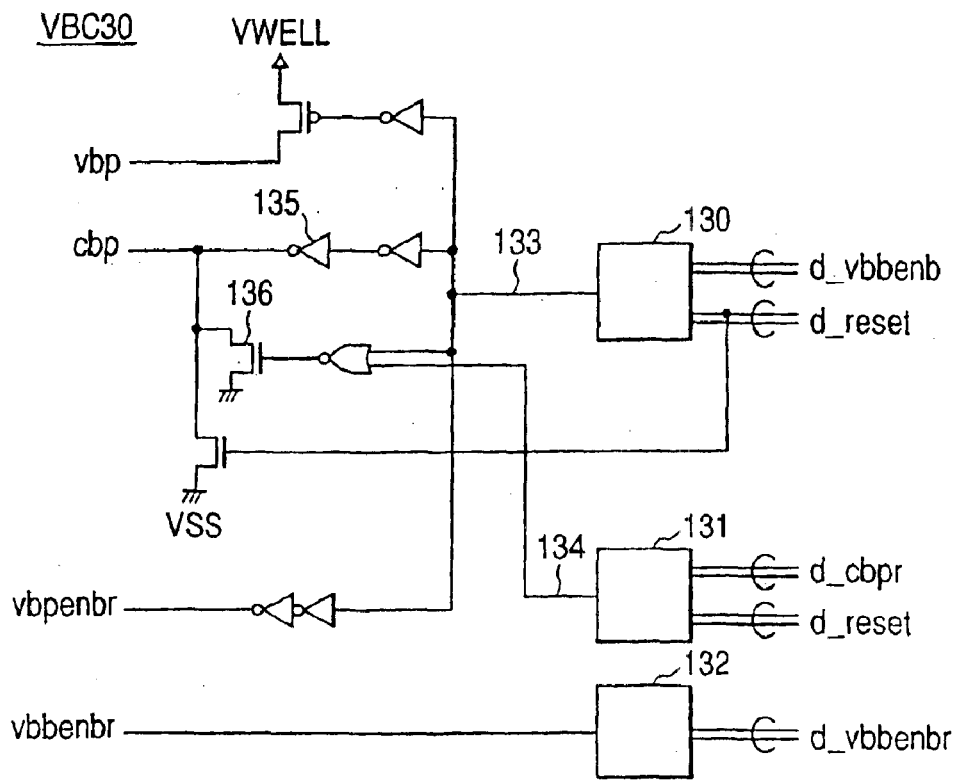
FIG. 8 is a circuit diagram of a VBC 30.

FIG. 8 is a circuit diagram of the VBC 30. Numeral 130 is a level converting circuit used to generate 3.3V-amplitude signals 133 (VWELL to VSS) from 1.8V-amplitude dual rail signals (VDD to VSS) of both d_vbbenb and d_reset signals. A signal 133 enters 'L' in the active state or when the power-on signal is reset.

Numeral 131 is also a level converting circuit used to generate 3.3V-amplitude signals 134 (VWELL to VSS) from 1.8V-amplitude dual rail signals (VDD to VSS) of both d_cbpr and d_reset signals. A signal 134 becomes 0V when the signal cbpr is 0V or when the power-on signal is reset. If a signal 133 becomes 0V in level, the signal vbp enters the high impedance state and both cbp and cbpenbr become 0V. If the signal cbp becomes 0V, the MP1 in every swcell in the main circuit is activated and the signal vbp is driven into 1.8V.

Numeral 132 is also a level converting circuit used to output the signal d_vbbenbr from the VBC 80 shown in FIG. 7 as a 3.3V-amplitude signal vbbenbr.

Figure 9:
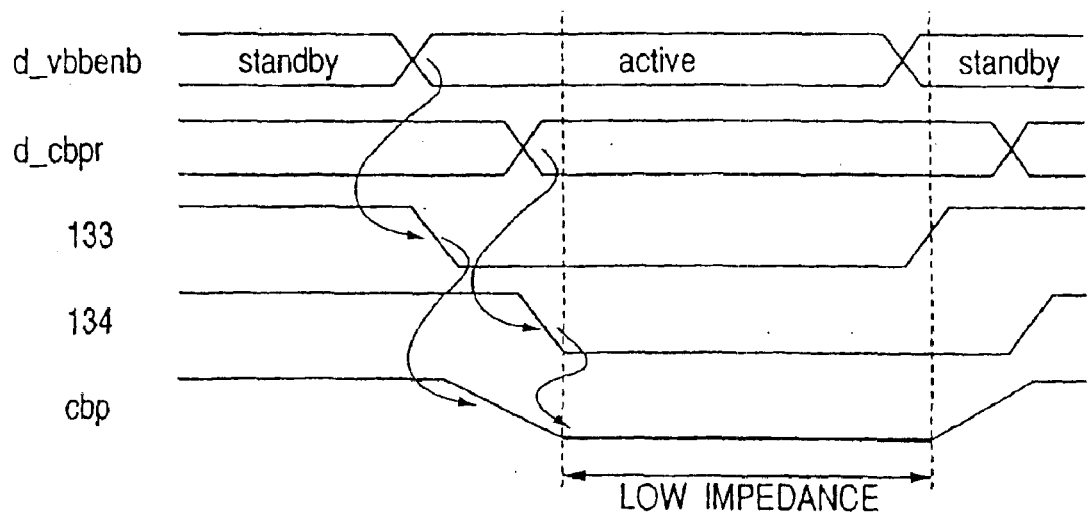
FIG. 9 is an operation waveform of the VBC 30.

FIG. 9 shows how the signal level of cbp is changed. The output impedance of the cbp is changed in two steps. The cbp is driven by the inverter 135 controlled by a signal 133. If both signals 133 and 134 are 0V, the NMOS 136 is activated, thereby the cbp is driven. In this embodiment, the gate width of the NMOS 136 is set more wider than that of the NMOS in the inverter 135. If the semiconductor IC unit enters the active state and the signal 133 becomes 0V, then the inverter 135 drives the cbp into 0V. However, since the cbp is wired in the whole main circuit and it is provided with a large load capacity, the cbp is driven into 0V slowly. This shift of the cbp is detected according to a shift of the signal cbpr, which is a return signal of the cbp. The signal d_cbpr is thus changed in level. Consequently, the signal 134 is driven into 0V and the NMOS 136 is activated. Consequently, the cbp is driven into 0V at a low impedance. Such way, the cbp is driven at a low impedance in the active state and less affected by a noise caused by an operation of the main circuit. And, if the cbp is driven into 0V, the MP1 in every swcell in the main circuit is activated. If the cbp is driven into 0V slowly as shown in FIG. 8(B), however, the MP1 in every swcell can be protected significantly from a simultaneous switching noise.

Figure 10:
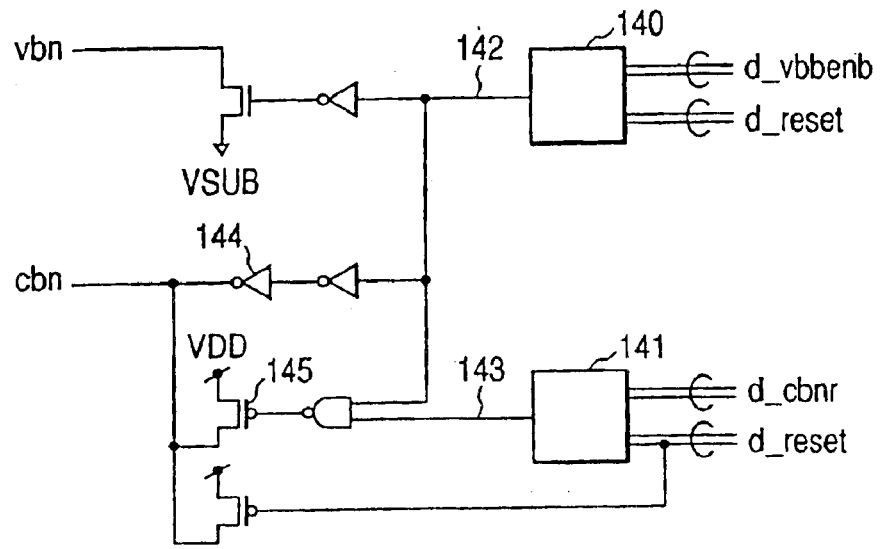
FIG. 10 is a circuit diagram of a VBC 85.

FIG. 10 shows a circuit diagram of the VBC 85. 140 is a level converting circuit used to generate 3.3V-amplitude signals 142 (VDD to VSUB) from 1.8V-amplitude dual rail signals (VDD to VSS) of both d_vbbenb and d_reset signals. A signal 142 becomes 1.8V in the active state or when the power-on signal is reset.

141 is also a level converting circuit used to generate 3.3V-amplitude signals 143 (VDD to VSUB) from 1.8V-amplitude dual rail signals (VDD to VSS) of both d_cbnr and d_reset signals. A signal 143 becomes 1.8V when the signal cbnr is 1.8V or when the power-on signal is reset. If a signal 142 is driven into 1.8V, the signal vbn enters the high impedance state and the signal cbn is driven into 1.8V. If the signal cbn is driven into 1.8V, the MN1 in every swcell in the main circuit is activated. The signal vbn is thus driven into 0V.

Figure 11:
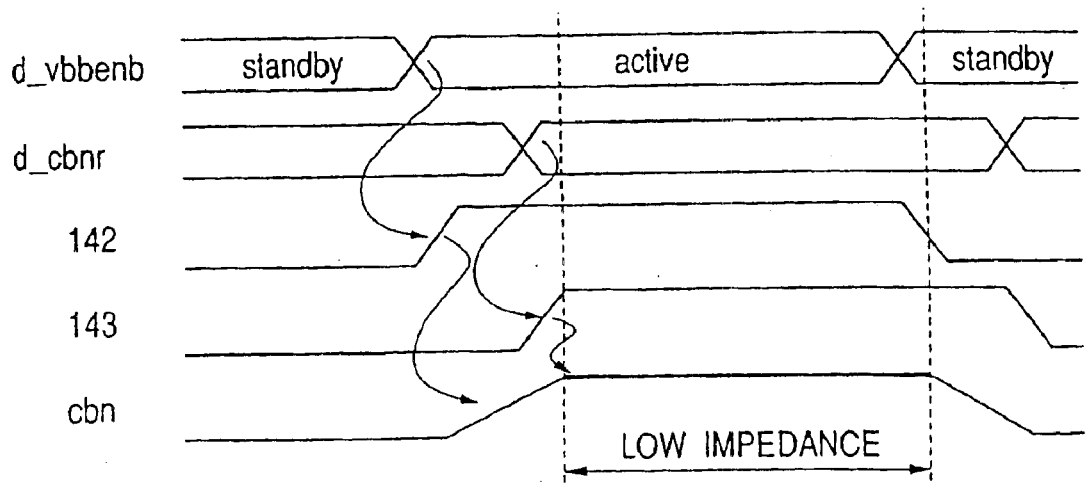
FIG. 11 is an operation waveform of the VBC 85.

FIG. 11 shows how the cbn is shifted. The output impedance of the cbn is changed in two steps just like the cbp. The cbn is driven by the inverter 144 controlled by the signal 143. When the signal 142 is 1.8V and the signal 143 is 1.8V, however, the PMOS 145 is activated, thereby it is also driven by the PMOS 145. In this embodiment, the gate width of the PMOS 145 is set larger than the gate width of the PMOS in the inverter 144. If the semiconductor IC unit is shifted into the active state and the signal 142 is driven into 1.8V, the inverter 144 drives the cbn into 0V. However, the cbn is wired in the whole main circuit and its load capacity is large. Therefore, the cbn is driven into 0V slowly. This shift is detected according to a shift of the return signal cbnr of the cbn, thereby the signal d_cbnr is changed in level. This drives the signal 143 into 1.8V and the PMOS 145 is activated. Consequently, the cbn is driven into 1.8V at a low impedance. Such way, when the semiconductor IC unit is active, the cbn is driven at a low impedance just like the cbp, thereby the semiconductor IC unit can be protected effectively from noise caused by the operation of the main circuit.

If the cbn is driven into 1.8V, the MN1 in every swell in the main circuit is activated. If the cbn is driven into 1.8V slowly as shown in FIG. 11, however, the simultaneous switching noise of the MN1 can be reduced in every swell.

As described above, according to the substrate bias controlling method of the present invention, the substrate driving impedance is smaller in the active state in which no bias voltage is applied to each substrate (the substrate is driven by every swell) than in the standby state in which a bias voltage is applied to each substrate (the substrate is driven by VBC). Consequently, if the semiconductor IC unit is shifted into the active state when it is powered as described above, it is possible to avoid problems of an increase of a current, owing to unstableness of the substrate potential, that goes through power sources at a power-on time, as well as a latch-up problem. In addition, although the substrate noise is increased by the operation of the main circuit in the active state, the noise can be reduced thereby preventing the main circuit from problems such as malfunction, latch-up, etc., if the substrate driving impedance is suppressed low.

Figure 12:
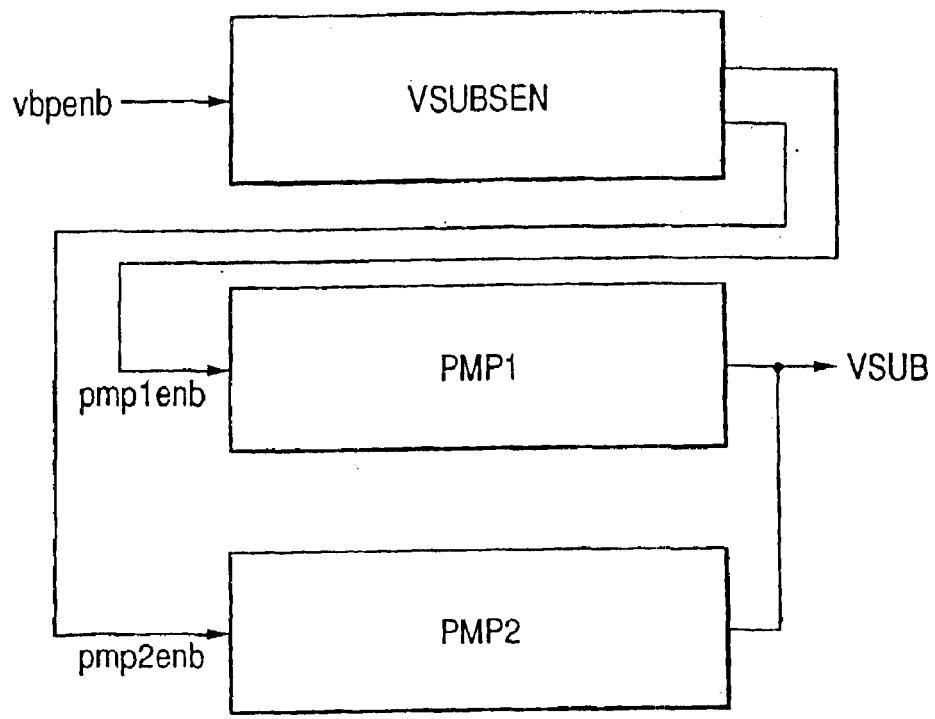
FIG. 12 is a block diagram of each circuit provided in a VSUBGEN.

FIG. 12 shows an internal configuration of the negative voltage generating circuit VSUBGEN. The circuit is composed of three circuit blocks. VSUBSEN is a substrate bias sensing circuit, PMP1 is a charging pump circuit 1, and PMP2 is a charging pump circuit 2. The substrate bias sensing circuit VSUBSEN monitors the VSUB potential, as well as both active and standby states using the signal vbpenb. And accordingly, PMP1 and PMP2 can be controlled using control signals pmp1enb and pmp2enb so as to satisfy VSUB=VDD+VSS−VWELL.

PMP1 is started when the signal pmp1enb is asserted and PMP2 is started when the signal pmp2enb is asserted. The pumping capacity makes a difference between PMP1 and PMP2. PMP1 has a pumping capacity larger than that of PMP2. The signal vbpenb choose to use between PMP1 or PMP2. PMP2 is used in the active state and PMP1 is used in the standby state.

The VSUB potential is used only in the substrate bias controlling circuit when the semiconductor IC unit is in the active state. Thus, so much current does not flows into the VSUB. Consequently, the PMP2, whose pumping capacity is small, is used. In the standby state, the VSUB potential is supplied to the whole main circuit. Such a current as a junction current, etc. thus flows into the VSUB. Consequently, the PMP1, whose pumping capacity is large, is used.

Figure 13:
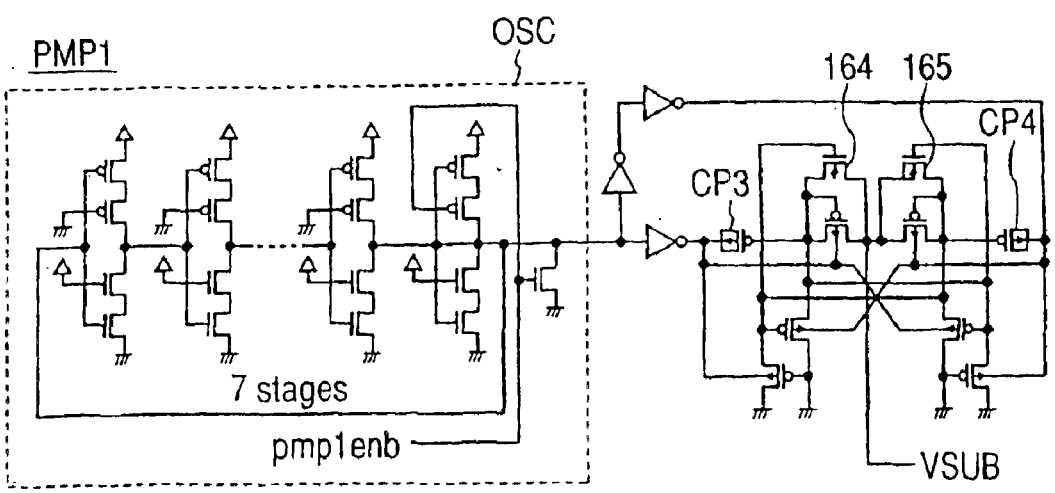
FIG. 13 is a circuit diagram of a charging pump.

FIG. 13 shows a circuit diagram of the charging pump 1 PMP1 of the present invention. OSC is a ring oscillator, which ocillates to charge the VSUB to a negative voltage only when the signal pmp1enb is asserted.

Figure 14:
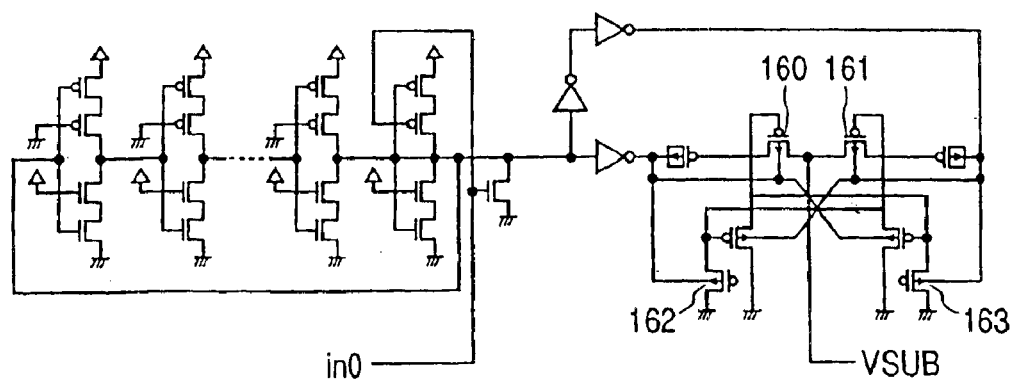
FIG. 14 is another circuit diagram of the charging pump.

FIG. 14 shows a circuit diagram of a charging pump obtained by adding PMOSs 162 and 163 to a charging pump circuit described in "VLSI memory (p266)" written by Kiyoo Ito and published by Baifukan. The charging pump charges the VSUB using PMOSs 160 and 162 twice during one cycle oscillation of the ring oscillator. According to the present invention, NMOSs 164 and 165 are further added to the charging pump as shown in FIG. 13. Consequently, the VSUB is less affected by the threshold levels of both PMOSs 160 and 161, so that the VSUB can function satisfactorily even at a low voltage operation. When VWELL is 3.3V, the configuration shown in FIG. 14 can obtain only VSUB=−3.3+vthp (vthp=absolute threshold level of both PMOSs 160 and 161); it would be VSUB=−2.3V at highest. On the contrary, according to the method of the present invention, it is possible to reach VSUB=−3.3V or so.

No circuit diagram is shown specially for the charging pump circuit 2 PMP2 in this embodiment. However, the capacity of each of the PMOSs CP3 and CP4 used as capacitors in FIG. 13 can be reduced thereby to reduce the capacity of each of the capacitors. Of course, the sizes of other MOS transistors can be optimized to be suited for this CP3 or CP4.

Figure 15:
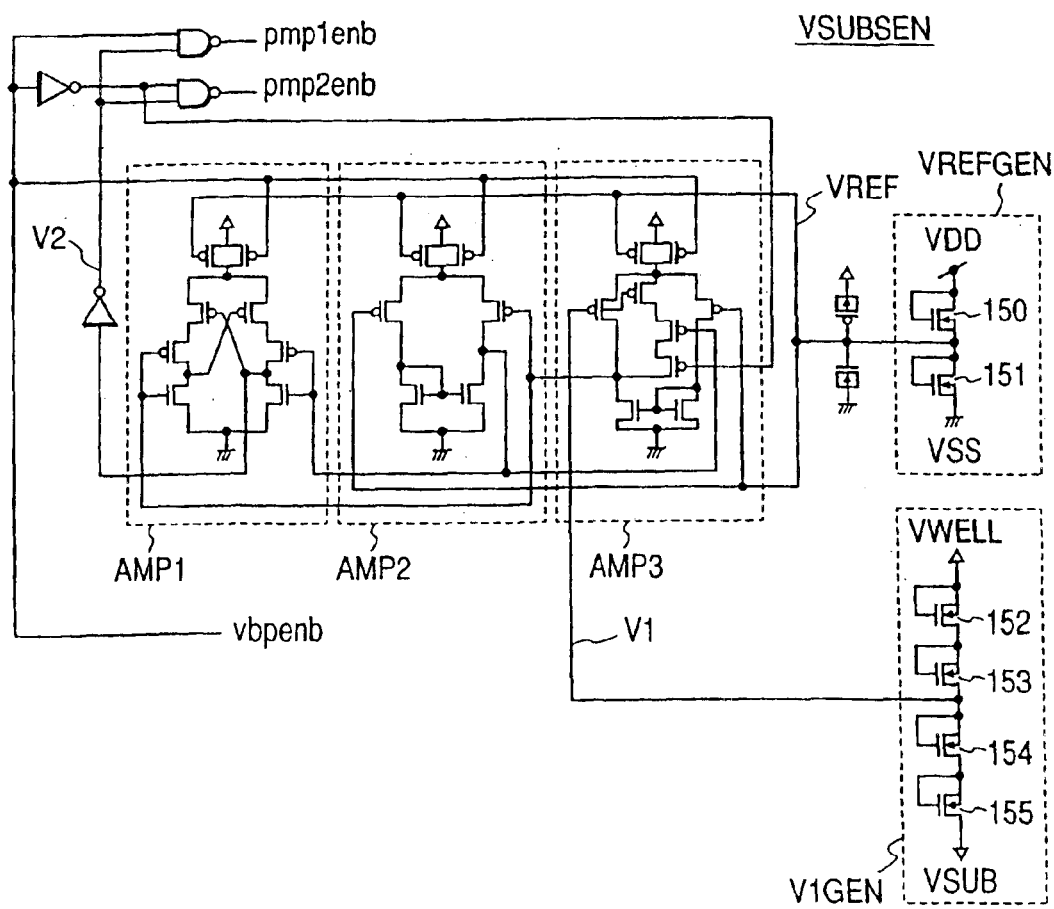
FIG. 15 is a circuit diagram of the VSUBSEN.

FIG. 15 shows a circuit diagram of the substrate bias sensing circuit VSUBSEN. VREFGEN is a reference voltage generating circuit used to obtain an output of VREF= (VDD−VSS)/2 from NMOS transistors 150 and 151 connected serially. V1GEN is a VSUB potential sensing circuit used to obtain an output of V1=(VWELL−VSUB)/2 from the NMOS transistors 152 to 155 connected serially. The circuit is composed so that about 1V is applied to between the source and drain of each NMOS transistor, as well as the gate is set long. Consequently, it becomes possible to suppress the continuous current from VDD to VSS or from VWELL to VSUB low. In addition, since the circuit is operated in a saturation area, the circuit can obtain VREF or V1 insensitively to a variance. Furthermore, the present invention uses NMOS transistors, not PMOS transistors. NMOS transistors are excellent in saturation characteristics more than PMOS transistors. The circuit can thus obtain VREF or V1 insensitively to a variance among NMOS transistors even when only about 1V is applied to between source and drain.

AMP1, AMP2, and AMP3 are differential amplifiers, which are combined to compose a differential amplifier. The differential amplifier composed of AMP1, AMP2, and AMP3 receives VREF and V1, and when in at VREF<V1, pmp1enb or pmp2en is asserted. Consequently, VSUB is charged to a negative voltage. When in VREF>V1, pmp1enb or pmp2enb is negated. Since VSUB causes a leakage current toward VSS, VWELL, and VDD, if both pmp1enb and pmp2enb are negated, VSUB is discharged to a positive potential. This pmp1enb or pmp2enb is asserted and negated repetitively, so that V1=VREF, that is, VSUB=VDD−VWELL is kept. If vbpenb is 3.3V (standby state) as described above, the pmp1enb is asserted. If vbpenb is 0V (active state), the pmp2enb is asserted.

A feed-back path is formed between AMP1 and AMP2. The differential amplifier composed of AMP1, AMP2, and AMP3 is thus provided with hysteresis-characteristics. The hysteresis characteristics mentioned here means a change of the differentiating point of a differential amplifier, caused by an output of the amplifier. In other words, it means Schmitt characteristics. Consequently, it is prevented that pmp1enb or pmp2enb is asserted/negated many times repetitively around V1=VREF, thereby to prevent an increase of the power consumption.

Furthermore, the operation current of the differential amplifier is changed within AMP1 to AMP3 between when vbpenb is asserted and when it is negated. In the standby state when vbp is asserted, the vbn of the main circuit is connected to the VSUB. This means that a large substrate capacity is connected to the main circuit. The level of the VSUB is thus changed slowly. Since no fast operation is needed between AMP1 and AMP3, the operation current can be limited so that the power consumption is reduced in a process from AMP1 to AMP3. On the other hand, in the active state when the vbp is negated, only the substrate-bias controlling circuit VBC is connected to the VSUB. This means that a comparatively small capacity is connected to the VSUB. Consequently, the level of the VSUB is changed quickly, so that a fast operation is needed in a process from AMP1 to AMP3. In the active state, the power consumption is not so high. A large operation current is thus set in the process between AMP1 and AMP3 for enabling fast operations.

Hereunder, the substrate bias powering method will be described in detail in an embodiment of the present invention.

Figure 16:
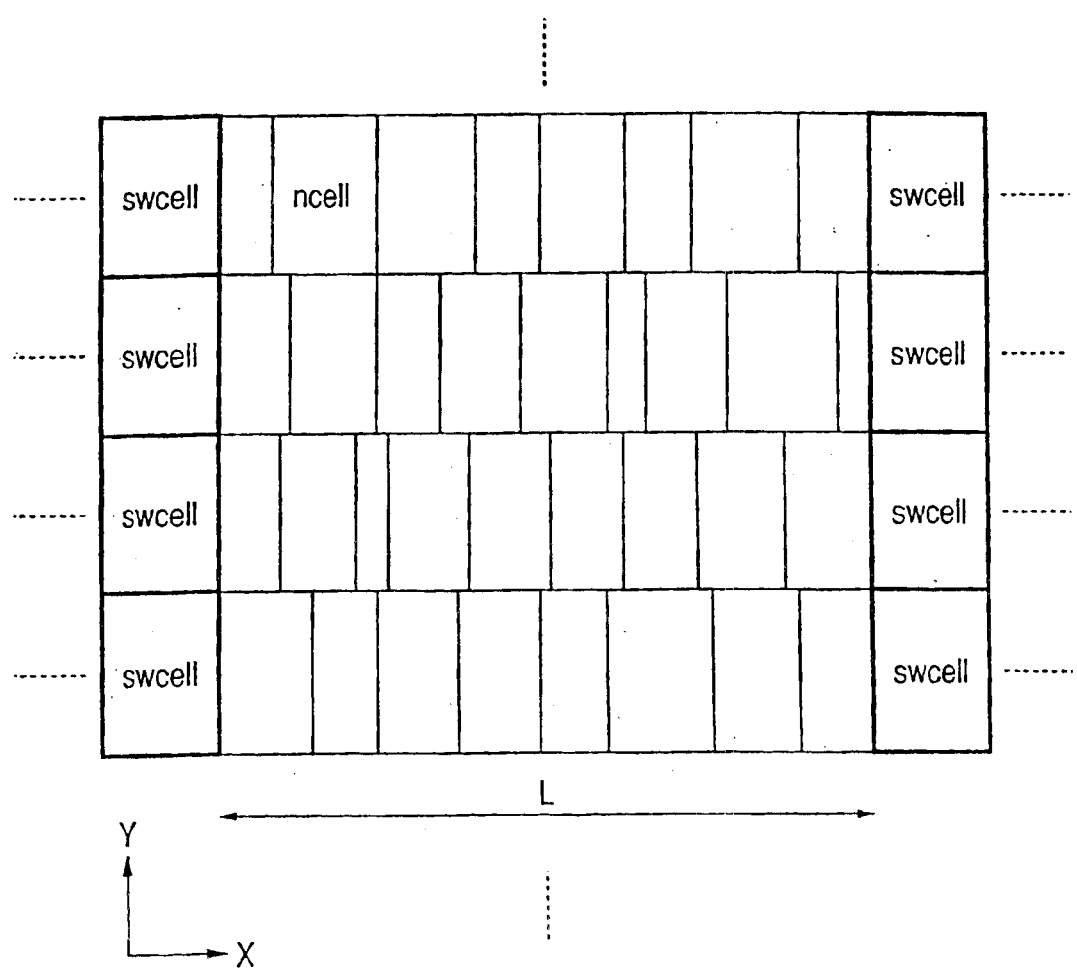
FIG. 16 illustrates how switch cells of the present invention are disposed.

FIG. 16 shows a layout of both ncells and swcells. The swcells are disposed continuously in the vertical (Y) direction. Both swcells and ncells are aligned in height. In the horizontal (X) direction, the swcells are disposed at variable pitches L within a certain value. Of course, those cells can be disposed at equal pitches, but varying the pitches would increase the freedom of the layout. In any way, the pitch L can be decided considering the following items.

Figure 17:
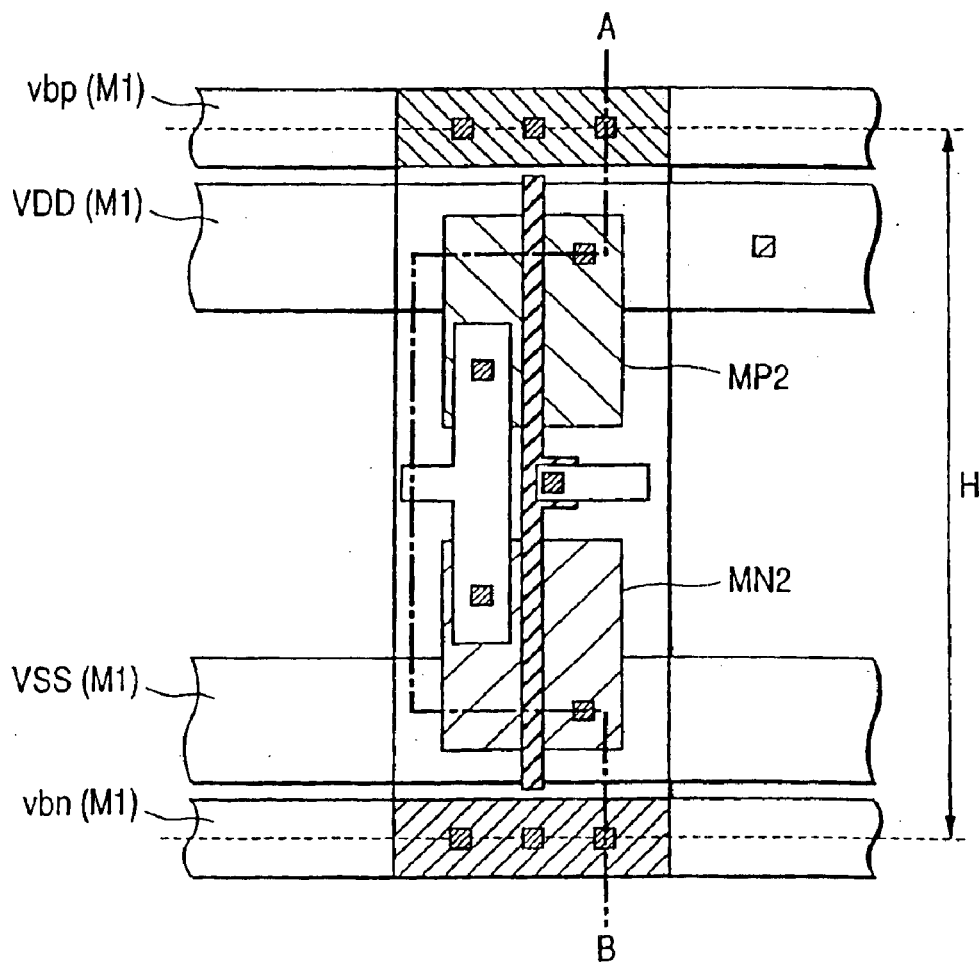
FIG. 17 is a layout of standard cells.
Figure 17:
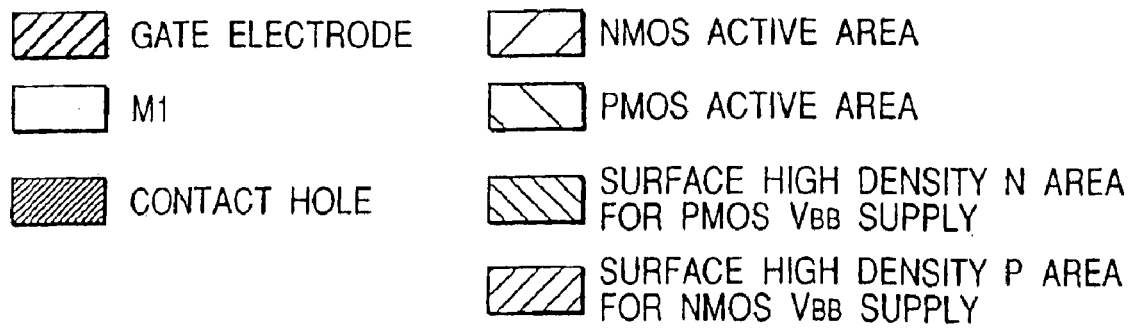

(1) Power line impedance
(2) Power wiring migration
(3) substrate noise generated in vbp and vbn according to the operation of ncells FIG. 17 shows an internal layout of an ncell. Just as in the case shown in FIG. 2, an inverter is taken as an example. The vbp, the vbn, the VDD, and the VSS are powered by the first layer metallic wiring consisting of four lines disposed in parallel (hereafter, to be described as M1). The vbp and the vbn are also powered by the surface high density layer respectively. H is a cell height, indicating a basic repetition unit in the vertical (Y) direction. The ncells are disposed in the vertical (Y) direction so as to be mirror images of each other with reference to this height. Consequently, both vbp and vbn can be shared by ncells adjacent at vertical positions, reducing the ncell area.

Figure 18:
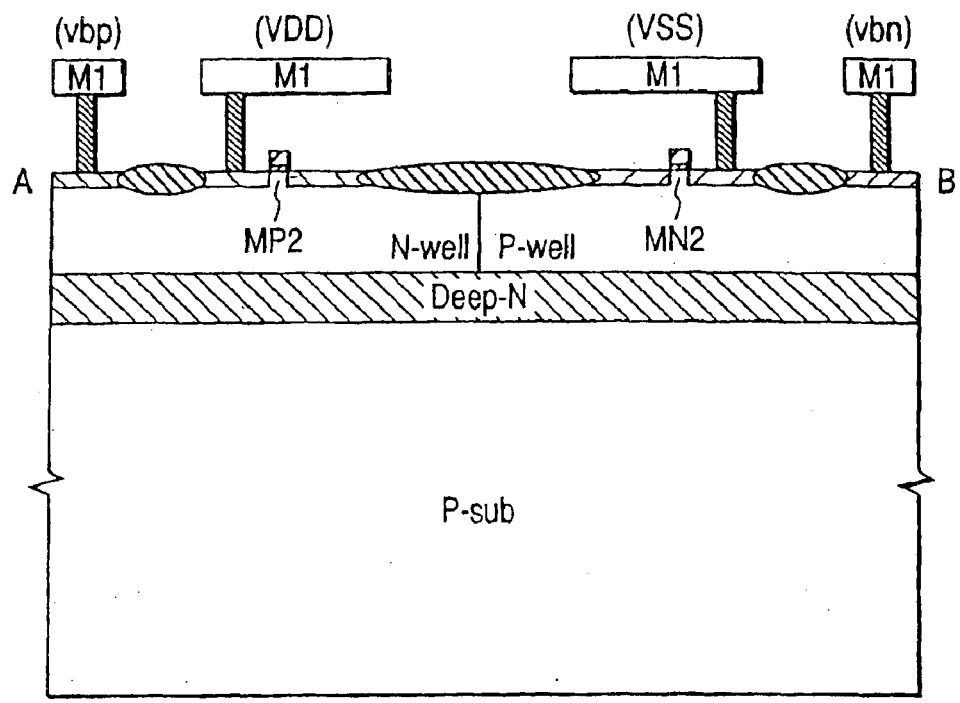
FIG. 18 is a cross sectional view of a standard cell shown in FIG. 17.

FIG. 18 shows a cross sectional view of FIG. 17 at the A–B line. N-well is an N-well used for forming MP2 and P-well is a P-well for forming MN2. Deep-N is an N-well disposed deeper than N-well and P-well. In other words, the ncell has a 3-layer well structure.

Figure 19:
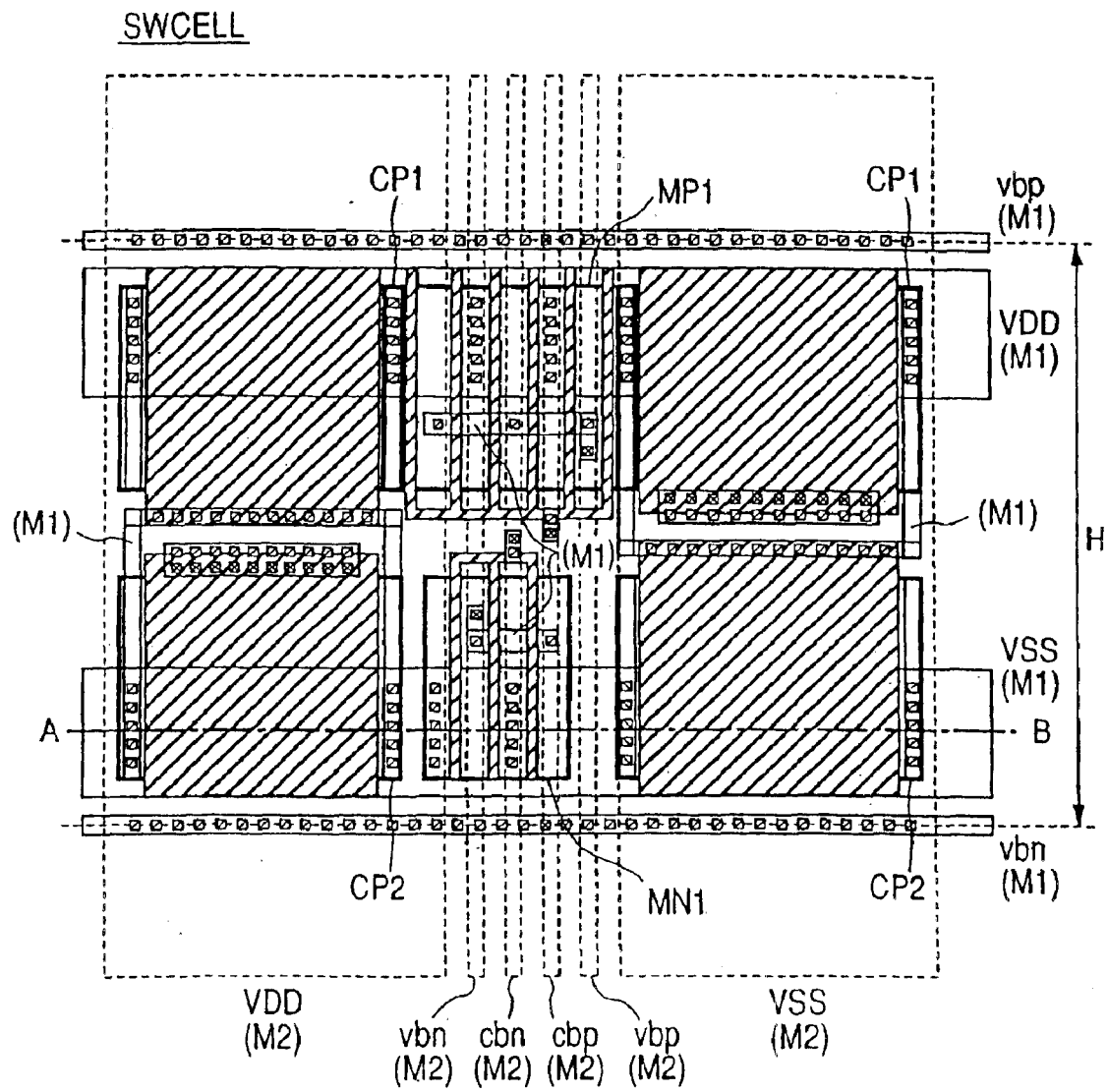
FIG. 19 is a layout of switch cells.

FIG. 19 shows an internal layout of an swcell. H is a cell height just as in the case of the ncell. The vbp, the vbn, the VDD, and the VSS are powered by M1 in the same way as those of the ncell. As shown in FIG. 16, the swcells are disposed continuously in the vertical (Y) direction. Horizontally, those cells are disposed at pitches restricted within a certain value. With such a disposition, it becomes possible to make wiring of power reinforcing lines at the swcell places. In FIG. 19, the second layer metallic lines disposed in parallel in the vertical direction are two power reinforcing lines. Between these two power reinforcing lines are disposed two reinforcing lines vbp and vbn and two other lines cbp and cbn. The power reinforcing lines VDD and VSS at both ends are effective to protect the four substrate bias control lines from external noise.

MP1 is formed with 6 separated transistors. The gate, drain, and source of each transistor in the MP1 are connected to cbp, vbp, and VDD respectively. MN1 is formed with 3 separated transistors. The gate, drain, and source of each transistor in the MN1 are connected to cbn, vbn, and VSS respectively. Each of the decoupling capacitors CP1 and CP2 is divided into two transistors. The transistors of both CP1 and Cp2 are positioned at both ends of the MP1 and MN1 respectively. The capacity of each of CP1 and CP2 is generated using a MOS gate capacity.

The ratio of the decoupling capacitors CP1 and CP2 to those of MP1 and MN1 is not limited specially. In an extreme example, one or both of the decoupling capacitors CP1 and CP2 are omissible. Power noise can be reduced with a decoupling capacitor if its size is increased. On the other hand, if MP1 and MN1 are increased in size, the substrate bias can be connected to a power source at a lower impedance when the microprocessor is in the normal state so as to be protected more effectively from noise, as well as from a latch-up trouble.

The VIA holes formed between the VDD lines of M1 and M2, as well as the VIA holes formed between the VSS lines of M1 and M2 are omitted here to simplify the description. A VIA hole can be formed at each intersection point of the wiring.

Figure 20:
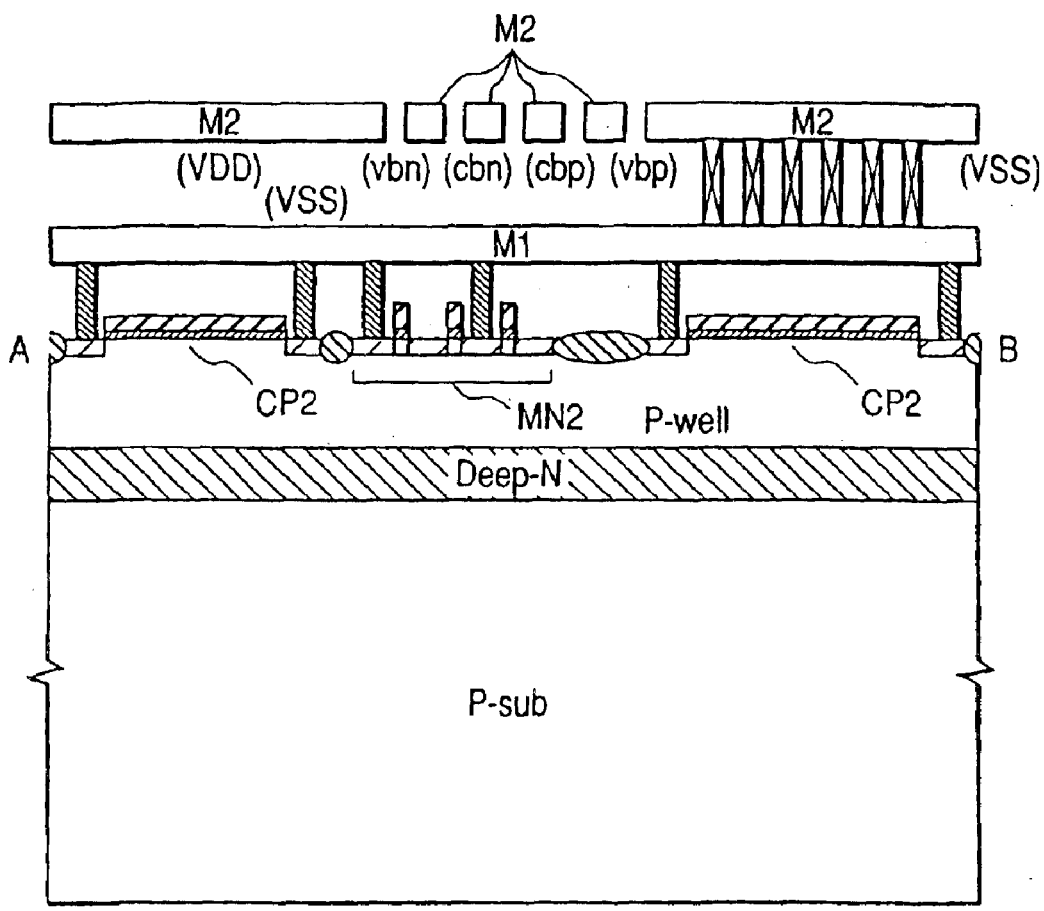
FIG. 20 is a cross sectional view of a switch cell shown in FIG. 19.

FIG. 20 shows a cross sectional view of FIG. 19 at the A–B line. Just as shown in FIG. 18, P-well is a P-well for forming the MN1 and Deep-N is an N-well disposed deeper than the P-well. The swcell thus comes to have a so-called 3-layer well structure. In this case, VIA holes, which are omitted in FIG. 19, are illustrated actually between the VSS lines of both M1 and M2. As shown in FIG. 2, a thick oxidization film transistor is used for MN2 so as to raise the threshold level.

Figure 21:
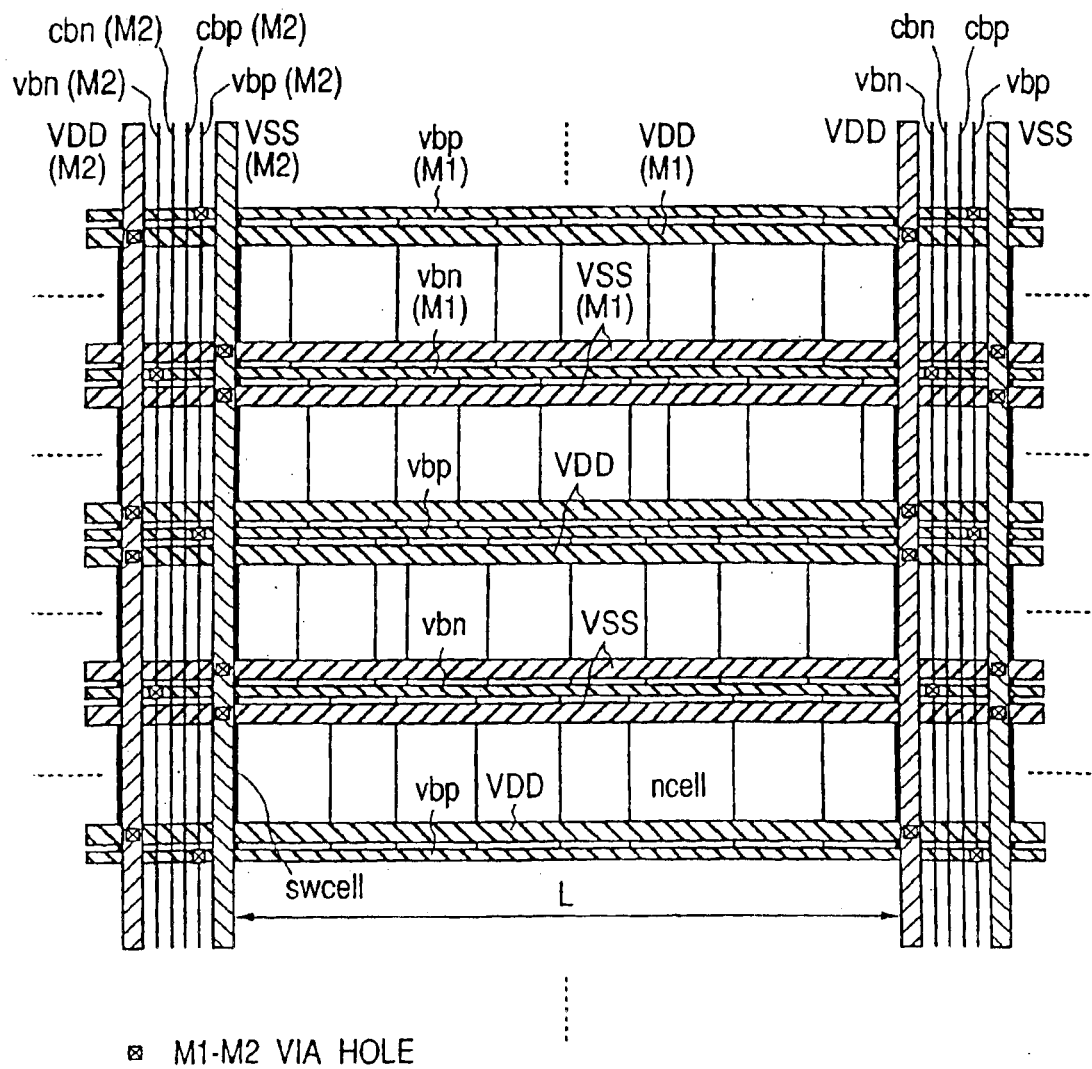
FIG. 21 is a wiring diagram of a power source and wiring diagrams of vbp, vbn, cbp, and cbn.

FIG. 21 shows a concrete example for how to wire the power lines VDD and VSS, as well as substrate bias control lines vbp, vbn, cbp, and cbn. The layout of power lines shown in FIG. 21 is obtained by adding the above lines to the layout shown in FIG. 16. In the horizontal (X) direction, VDD, VSS, vbp, and vbn are wired with M1 in parallel to each other. As shown in FIG. 17, the vbp is shared by two cells disposed vertically with the vbp therebetween. And, two VDD lines are laid in parallel above and under of those two cells. The vbn is also shared by two cells disposed vertically with the vbn therebetween. And, two VSS lines are laid in parallel above and under those two cells. Of course, both VDD and VSS lines can be thicker than vbp and vbn lines.

As shown in FIG. 19, VDD, VSS, vbp, vbn, cbp, and cbn wired with M2 are disposed on the swcells in the vertical (Y) direction. VDD, VSS, vbp, and vbn are connected to each other like a mesh at intersection points of M1 and M2.

Figure 22:
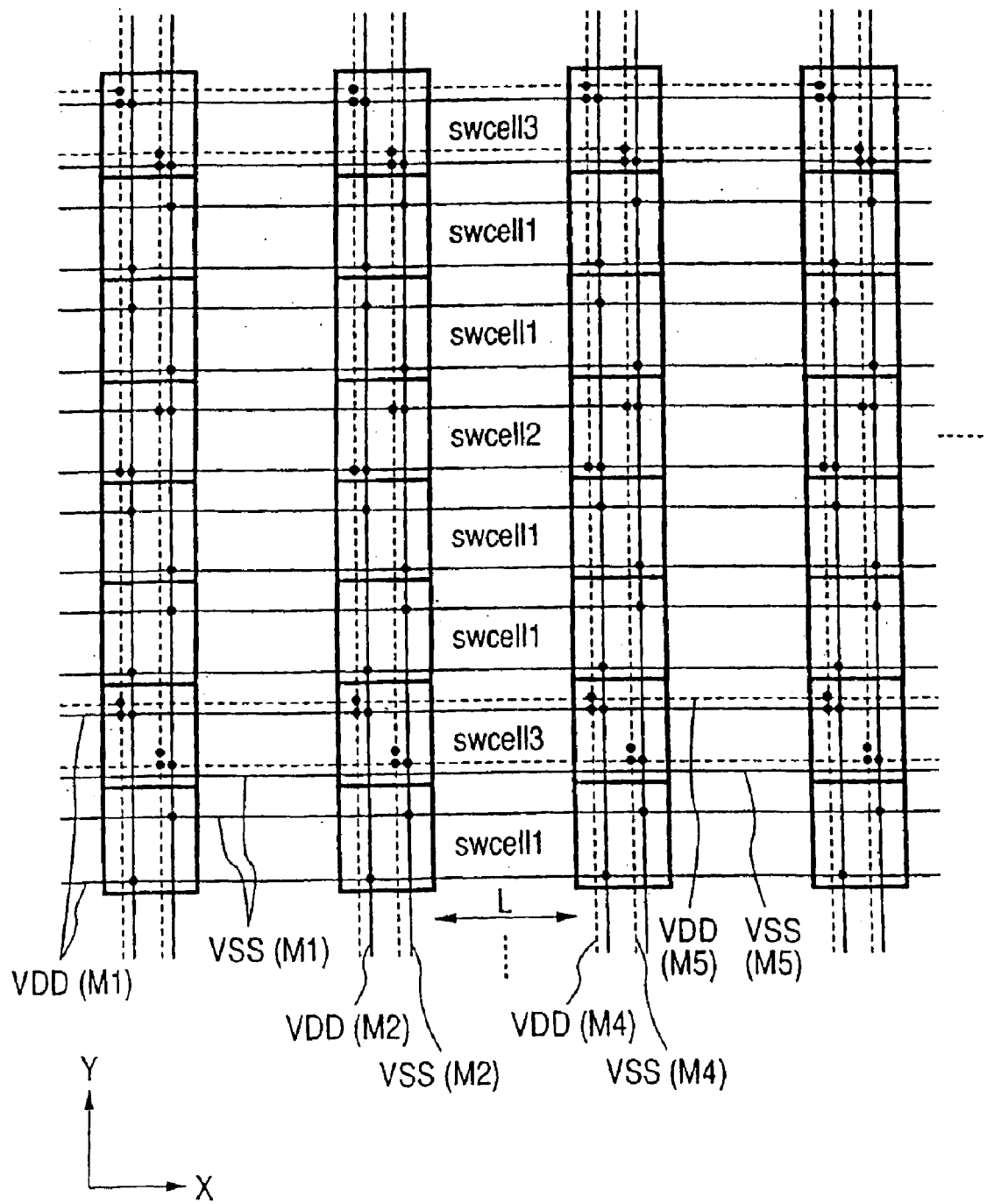
FIG. 22 is a wiring diagram of power source reinforcing lines.

FIG. 22 shows how power sources VDD and VSS are reinforced. The power source lines VDD and VSS formed with the fourth and fifth metallic wiring layers ( M4 and M5) are wired like a mesh in accordance with the basic repetition unit shown in FIG. 21.

Above the VDD and VSS formed with M2, which are wired in the vertical (Y) direction, are wired both VDD and VSS formed with M4. And, in order to connect those VDD and VSS to each other, the third metallic wiring layer ( M3) is needed. If those VDD and VSS are connected at every swcell, the M3 is wired vertically. This will arise a problem that no M3 path is formed in the horizontal (X) direction, however.

In FIG. 22, M2 and M4 power lines are connected every three swcells shown as swcell2 or swcell3. With this connection, M3 wiring paths can be secured in the horizontal (X) direction.

The M5 power line is wired only on every 6 swcells shown as swcell3. The M5 power line is thus connected to the M4 line at each swcell3, which is an intersection point of M5 and M4.

As described above, the fine pitch power source meshes of M1 and M2 are reinforced by the rough pitch power source meshes of M4 and M5, thereby to lower the impedance of each of the VDD and VSS power source lines.

Although each of the M4 power source lines in the vertical direction is wired at every swcell, the line may also be wired roughly every two or three swcells. Although the impedance of each of the power source lines increases, this wiring method makes it possible to secure M4 paths in the vertical direction.

Figure 23:
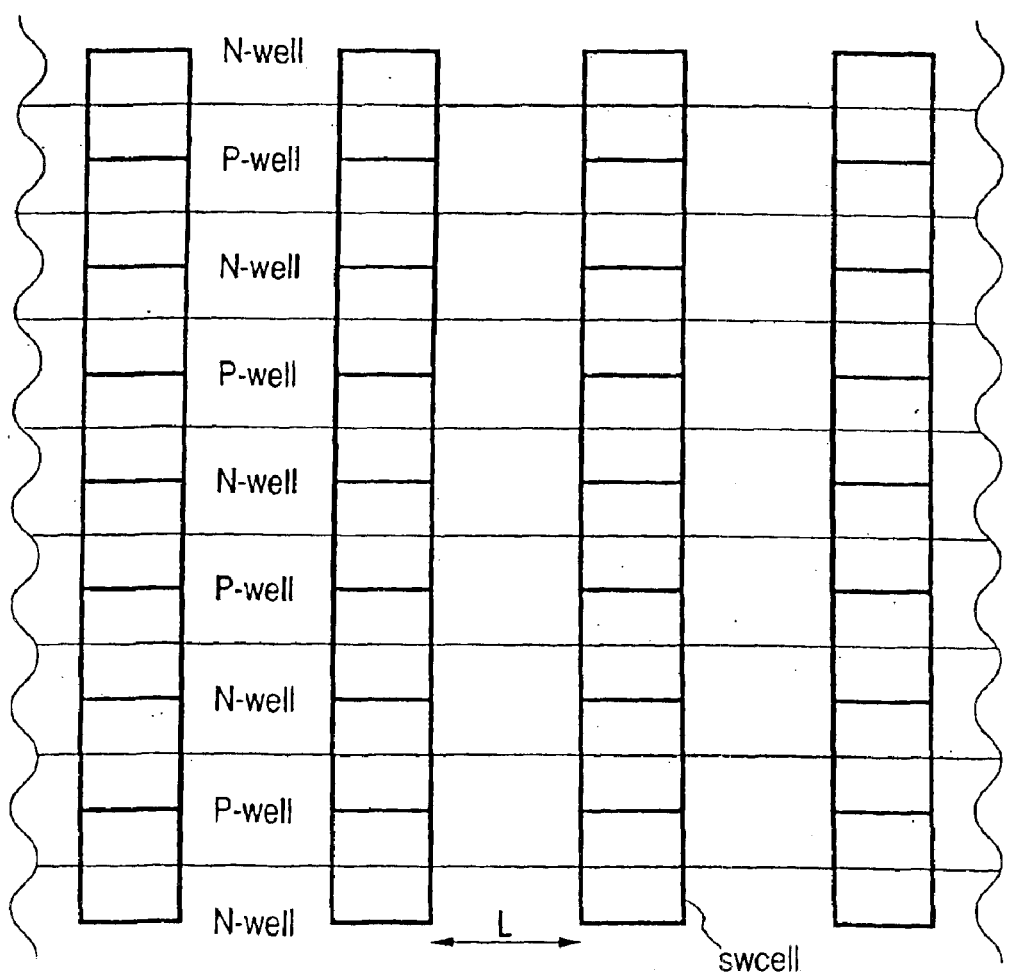
FIG. 23 is a block diagram of wells.

FIG. 23 shows the relationship between swcells and wells disposed as shown in FIG. 22. P-wells and N-wells are disposed alternately like belts so that two ncells share one well.

Figure 24:
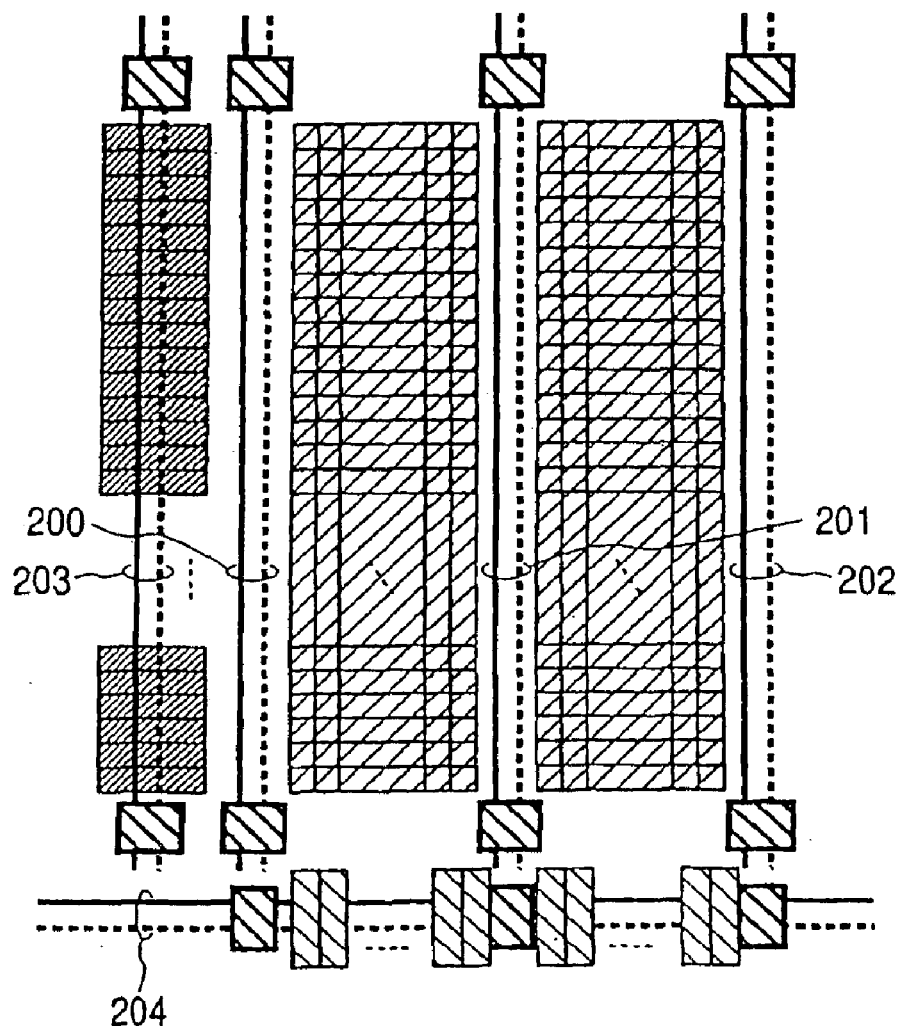
FIG. 24 illustrates how switch cells are disposed in a memory circuit.
Figure 24:
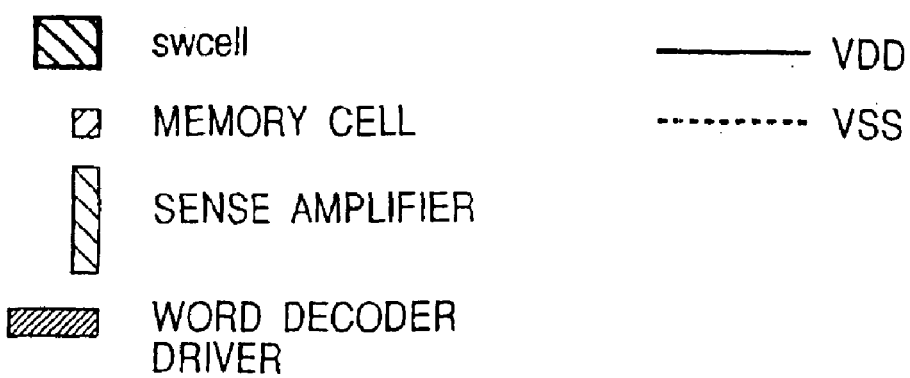

FIG. 24 shows a layout of both memory circuit swcells and power source lines. In FIG. 24, none of word and bit lines is illustrated, but word lines are disposed actually in the horizontal (X) direction and bit lines are disposed actually in the vertical (Y) direction respectively. The memory mat power source lines wired horizontally in the memory cells are reinforced by the power lines 200, 201, and 202 provided at both ends thereof. Numeral 203 is a power line for supplying an electric power to each of word drivers and decoders. 204 is a power line for supplying an electric power to each sense amplifier. Cells swcell are disposed for each of the power lines 200 to 204 as shown in FIG. 24.

Usually, only one or two of a plurality of word drivers and a plurality of word decoders work simultaneously. Consequently, substrate noise is not generated so much. This is why only two swcells are disposed at both ends of the power line 203 as shown in FIG. 24.

On the contrary, many sense amplifiers work simultaneously. However, the potentials inside the sense amplifier are set so that the number of nodes in which the level is shifted from 'L' to 'H' and the number of nodes in which the level is shifted from 'H' to 'L' becomes almost equal. Consequently, even when many sense amplifiers work simultaneously, substrate noise is not generated so much. In this case, swcells are disposed at positions other than both ends of the power line 204 shown in FIG. 24, thereby effective to reduce substrate noise.

There will be considered many other methods for how to dispose swcells. In short, however, what is important is only that many more swcells should be disposed on the same well according to how many devices will run simultaneously on the same well. It is also possible to evaluate the change of a diffusion layer existing in a well by |NH−NL|/NA (NH=the area of the diffusion layers except for the diffusion layer connected to a power source, NH=the area of a diffusion whose potential is changed from 'H' to 'L', NL=the area of a diffusion layer whose potential is changed from 'L' to 'H'), then decide the number of swcells, the pitches L of swcells, and the size of MOS transistors in a swcell with reference to the evaluation result. In short, what is needed is just minimizing the |NH−NL|/NA value.

For example, for a circuit that has a regular data flow such as a data path, it is only needed to control so that data flows in the X direction shown in FIG. 22 in the data path. Since the cells that are operated simultaneously are distributed into a plurality of wells, the above |NH−NL|/NA is reduced.

Figure 25:
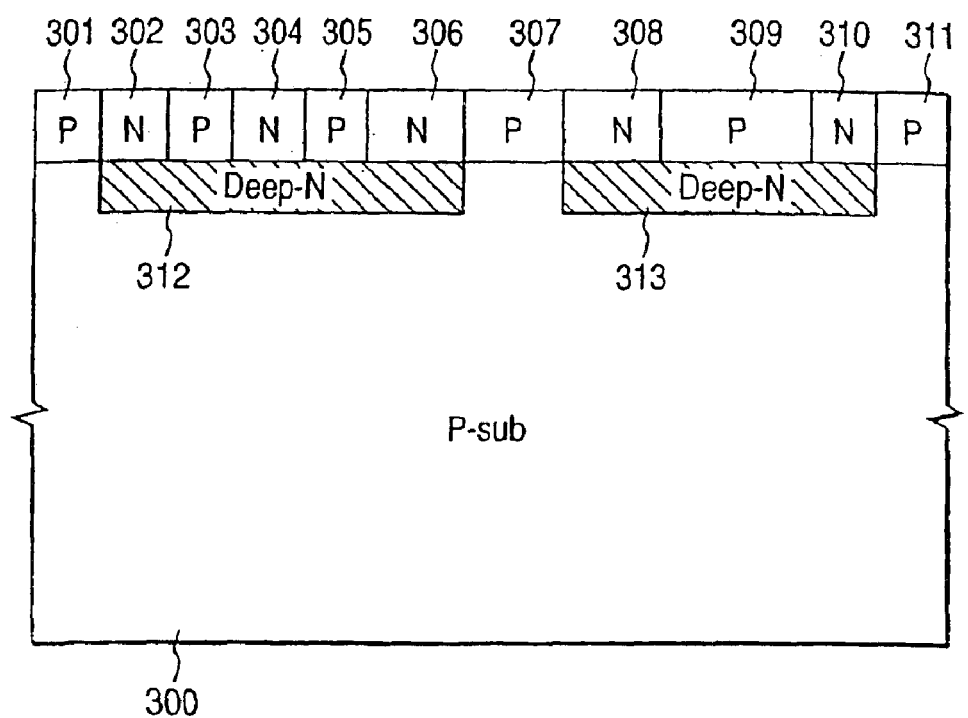
FIG. 25 is a cross sectional view of a well.

FIG. 25 shows a cross sectional view of a semiconductor IC unit of the present invention. As shown in FIG. 18, the Ns shown as 302, 304, 306, 308, and 310 are the same as an N-well respectively used to form a PMOS transistor. The Ps shown as 301, 303, 305, 307, 309, and 311 are the same as a P-well respectively used to form an NMOS transistor. The Deep-Ns shown as 312 and 313 are N-wells formed at deeper positions than Ns and Ps. The semiconductor IC unit has a "triple well structure".

The Deep-Ns 312 and 313 are separated electrically by a p-substrate 310 and a P-well 307. Consequently, the substrate potential of the MOS transistors A formed on 302, 304, 306, 308, and 310 can be decided independently of the substrate potential of the MOS transistors B formed on 301, 303, 305, 307, 309, and 311, and vice versa. In addition, the noise, etc. generated from the MOS transistors A can be suppressed so as to effectively protect the MOS transistors B from its influence.

Figure 26:
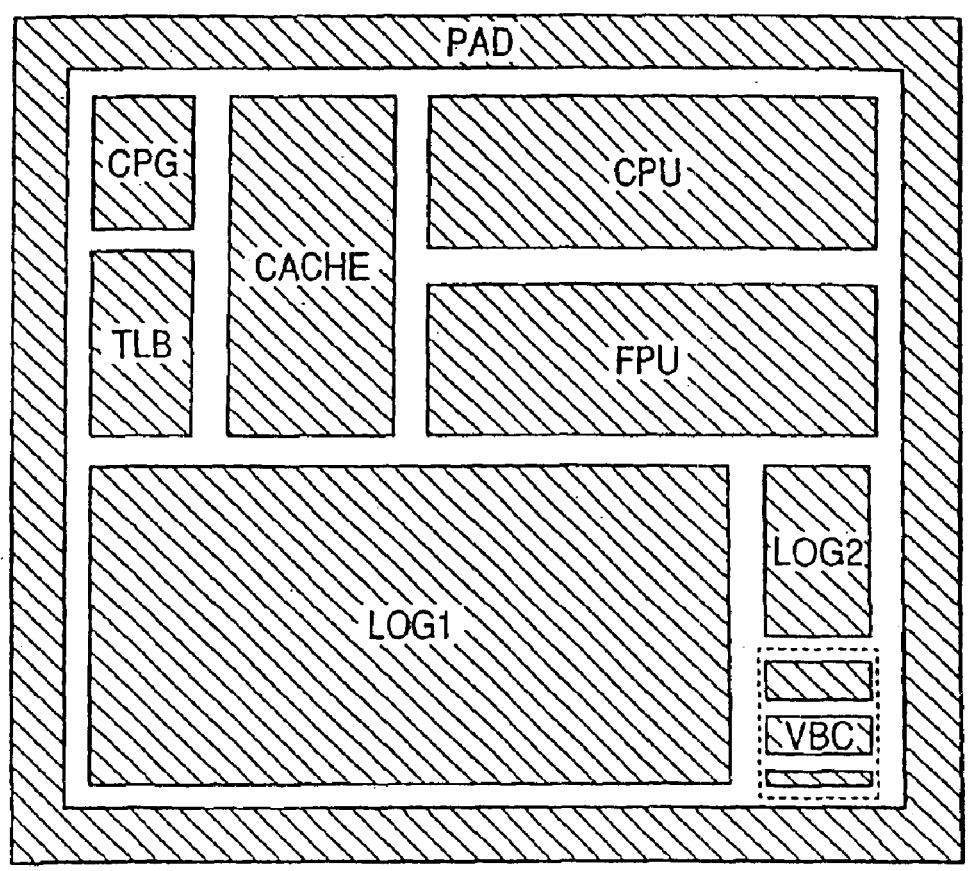
FIG. 26 is a layout of Deep-N wells.

FIG. 26 shows the Deep-N structure of the semiconductor IC unit of the present invention. CPG is a clock controller and it includes analog circuits such as a PLL (Phase Locked Loop), etc. TLB is an address converter and CACHE is a cache memory. CPU is a central processing unit, FPU is a floating-point arithmetic unit, LOG1 is a random logic 1, LOG2 is a random logic 2, and PAD is an I/O unit. Each circuit block is formed such way on a Deep-N different from others.

As shown in FIG. 25, it is possible to reduce the influence of a noise generated in each circuit block to be exerted on other blocks. For example, since PAD drives external pins with a larger amplitude than the internal signal amplitude, it generates much noise. This noise can be prevented from exerting on analog circuits such as a CPG, etc.

Furthermore, since a substrate potential can be applied to each block independently of others, it is possible to dispose circuits whose substrate is not controlled by any of vbp, vbn, cbp, and cbn in LOG2. In other words, it is possible to dispose a circuit in which a power source is connected to the substrate potential (VDD=vbp, VSS=vbn) in the LOG2.

Figure 27:
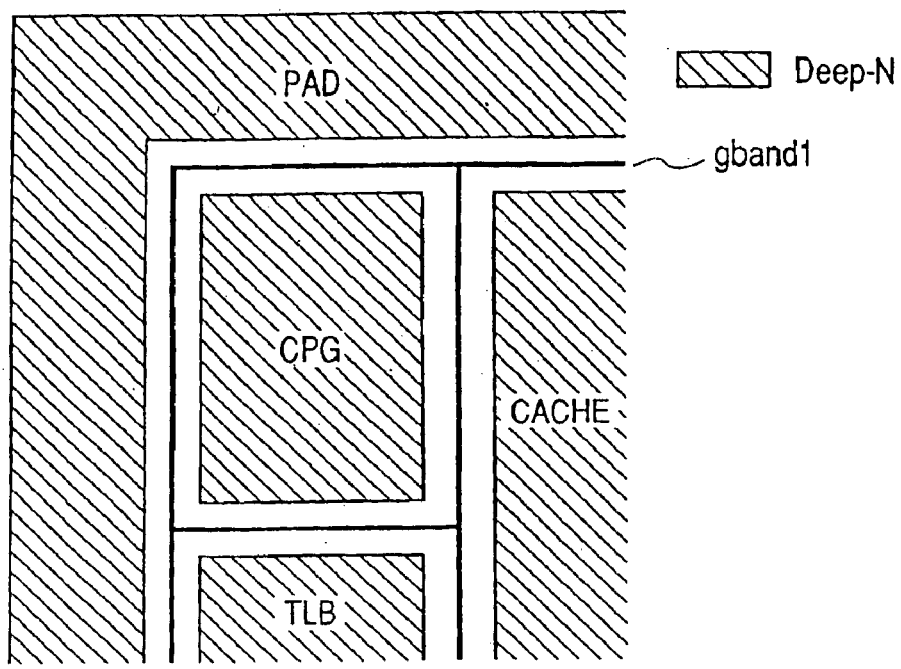
FIG. 27 is a layout of Deep-N wells and a guard band.

FIG. 27 shows a guard band disposed between Deep-Ns. A guard band gband1 is thus disposed between the Deep-Ns as shown in FIG. 27.

Figure 28:
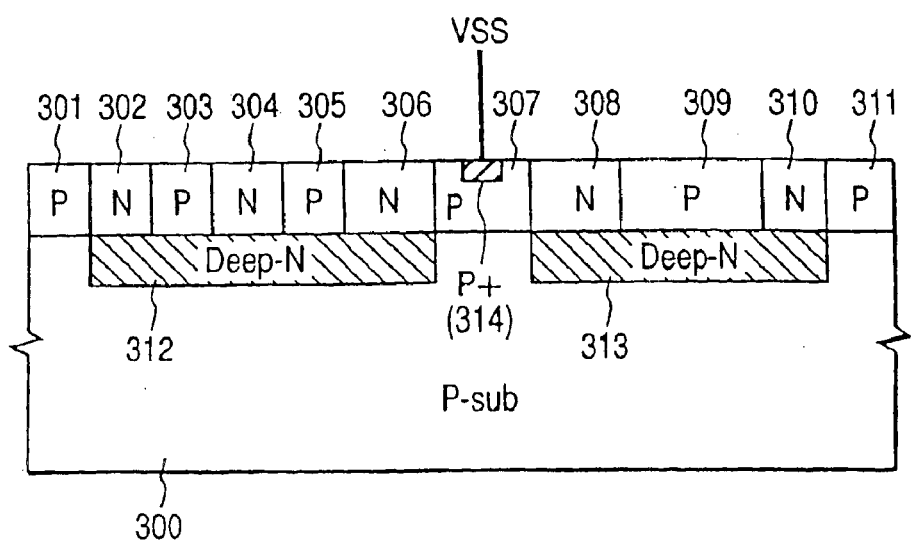
FIG. 28 is a cross sectional view of FIG. 27.

FIG. 28 shows a cross sectional view of the guard band shown in FIG. 27. A P-well 307 provided between Deep-Ns is then grounded to the VSS potential through the P+ diffusion layer 314. This makes it possible to further reduce the transmission of a noise between the Deep-Ns. For example, the substrate noise generated in a MOS transistor on the P-well 305 is transmitted to the Deep-N 312 due to a capacitive coupling, since the impedance of the Deep-N 312 is not so low. And, when this noise is to be transmitted to the p-substrate 300 due to the capacitive coupling in the same way as in the above case, the p-substrate is fixed to the ground potential by a guard band at a low impedance. The noise, when appearing on the p-substrate, is thus reduced. Such way, it is suppressed effectively for the noise generated from the MOS transistors formed on 302, 304, 306, 308, and 310 to be transmitted to the MOS transistors formed on 301, 303, 305, 307, 309, and 311.

Figure 29:
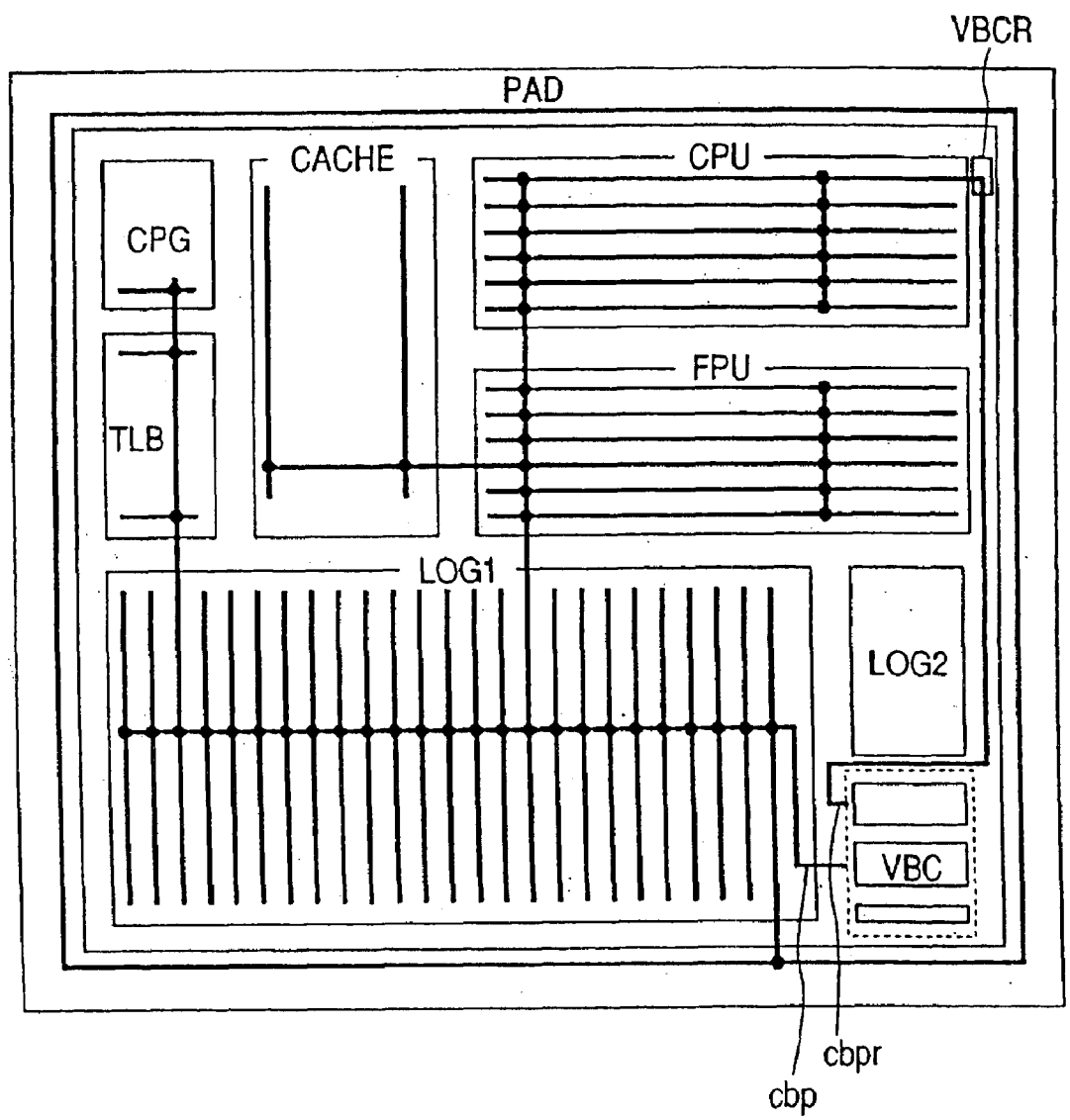
FIG. 29 illustrates how cbpr, cbnr, and VBCR are disposed.

FIG. 29 shows layout images of both cbp and cbpr on a semiconductor IC unit and the position of the return cell VBCR shown in FIG. 2. The description of both cbn and cbnr will be omitted here, since it is the same as that of both cbp and cbpr. The vbp and the vbn are wired like a mesh, since swcells are disposed side by side as shown in FIG. 21. However, the cbp and the cbn are not wired like a mesh; they are wired like stripes. FIG. 29 shows swcells disposed and connected so as to shunt the stripe-like wiring. And, a return cell is used to return entered cbp and cbn to the substrate bias controlling circuit VBC as cbpr and cbnr. A return cell is thus disposed so that cbpr is returned at a later timing than the arrival of the cbp of the swcell whose transmission time for cbpr is the latest among the swcells. For example, such a return cell should be disposed farthest from the substrate bias controlling circuit VBC.

In the above embodiment, the potential to be applied to the substrate bias is 1.8V or 0.0V in the active state and 3.3V or −1.5V in the standby state. The potential value can be varied freely. In the active state, a proper potential can be applied to the substrate bias thereby to adjust the variance of the threshold level of the MOS transistors.

The main circuit can also be divided into a plurality of circuit blocks, so that each of those circuit blocks is provided with a controlling circuit such as VBC 30, VBC 85, etc., thereby each circuit block is provided with active and standby states. Each circuit block can thus be controlled so that other idle circuit blocks are set in the standby state. Consequently, power consumption can be controlled for the semiconductor IC unit of the present invention more effectively in detail. In some circuit blocks, it is no need to apply a bias voltage to the substrates respectively even in the standby state. For example, it is such a case that an object circuit block is composed of MOS transistors whose threshold level is high and the subthreshold leakage current can be neglected.

According to the above embodiment, the threshold level of the MOS transistors is set low in the active operation mode and high in the standby operation mode of the semiconductor IC unit respectively. However, the bias voltage to be spplied to the substrate can be set so that a high threshold level is assumed for an IDDQ test as described in 1996 IEEE SPECTRUM (pp.66–71)

If a high threshold level is assumed, the substrate should be applied a larger substrate potential for an IDDQ test than the substrate potential applied in the standby mode. In other words, PMOSFET should be applied a higher potential than that in the standby mode and NMOSFET should be applied a lower potential than that in the standby mode. This enables to reduce the subthreshold leakage current that flows at an IDDQ test, improving the accuracy of trouble locating.

In order to enable such the operation, the VWELL potential is increased, for example, from 3.3V to 4.0V and the VSUB potential is lowered from −1.5V to −2.2V for an IDDQ test. For a circuit, however, a proper measure should be taken to prevent a through-current from flowing in an object circuit even the VWELL potential is set differently from the VDDQ potential. For this purpose, all the signals to be transmitted to the substrate bias controlling circuit must be level-downed in the VBC 80, then their potential must be converted to the VWELL or VSUM potential before use. The object circuit should be provided with a buffer used for such a voltage to realize the above operation According to the above embodiment, the substrate structure is composed of 3 well layers. The structure can be varied, for example, to a so-called twin-tab 2-well structure or an SOI (Silicon on insulator) structure.

Furthermore, as shown in FIGS. 17, 19, and 21, M1 supplies a substrate bias power in cells. This structure can be varied, however. For example, such a power can also be supplied from a diffusion layer or a silicide-transformed diffusion layer as described in 1997 Symposium on VLSI circuits Digest of Technical Papers, pp.95–96.

The explanation of reference symbols in the drawings of the present application is written together in the following.

VBC: Substrate bias controlling circuit, LOG: Main circuit, VBCC: Stand-by controlling circuit, I/O: I/O circuit, vbbenb: Substrate bias controlling start signal, vbbenbr: Substrate bias controlling-now signal, vbp: PMOS substrate bias line, vbn: NMOS substrate bias line, cbp: PMOS substrate controlling line, cbn: NMOS substrate controlling line, cbpr: PMOS substrate control return line, cbnr: NMOS substrate control return line, AMP1 and AMP2: Differential amplifier, AMP3: Schmitt input differential amplifier, VBCR: Return cell, swcell: Switch cell, ncell: Standard cell, P-sub: P-substrate, PLL: Phase locked loop, CPG: Clock controller, TLB: Address transformer, CHCHE: Cache memory, CPU: Central processing unit, FPU: Floating-point arithmetic unit, PAD: I/O unit.

INDUSTRIAL APPLICABILITY

As described above, the present invention can provide a semiconductor IC unit, such as a microprocessor, etc., which can satisfy the following requirements with respect to fast operation and lower power consumption properties:

(1) It is easy to test the substrate bias controlling circuit.
(2) It is possible to prevent each CMOS circuit from malfunction by controlling the substrate bias.
(3) It is possible to minimize an increase of each circuit area by controlling the substrate bias.
(4) It is possible to prevent the semiconductor IC unit from malfunction when the substrate bias is changed over.

What is claimed is:

1. A semiconductor integrated circuit device comprising:

a logic circuit including a plurality of areas, each of the areas including at least a first MOS transistor of a first conductivity type;

a substrate bias control circuit to control a state of the logic circuit, an output impedance to drive a substrate bias voltage of the first MOS transistor in a first state being lower than the output impedance to drive the substrate bias voltage of the first MOS transistor in a second state;

first and second power supply lines to supply the logic circuit with the supply voltage;

a first substrate bias voltage supply line; and a plurality of second MOS transistors of the first conductivity type, at least one of the second MOS transistors being provided to the plural areas;

wherein the control circuit controls the logic circuit to be in the first state when a supply voltage of the logic circuit is activated, wherein a source of the first MOS transistors is connected to the first power supply line, a drain of the first MOS transistor is connected to the second power supply line and the substrate bias voltage of the first MOS transistor is supplied via the first substrate bias voltage supply line, wherein a source-drain path of each of the second MOS transistors are provided between the first power supply line and the first substrate bias voltage supply line, and wherein the plurality of the second MOS transistors are controlled to be ON state when the logic circuit is in the first state.

2. The semiconductor integrated circuit device according to claim 1, wherein the substrate bias control circuit includes a power-on resetting circuit to generate a reset signal in accordance with the supply voltage of the logic circuit, and wherein the control circuit controls the logic circuit to be in the first state in response to the reset signal.

3. The semiconductor integrated circuit device according to claim 1, wherein when the logic circuit is in the first state, an absolute value of a threshold voltage of the first MOS transistor is a first value by controlling the substrate voltage, and wherein when the logic circuit is in the second state, the absolute value of the threshold voltage of the first MOS transistor is a second value higher than the first value by controlling the substrate voltage.

4. The semiconductor integrated circuit device according to claim 1, further comprising:

a second substrate bias voltage supply line;

a plurality of fourth MOS transistors of a second conductivity type, at least one of the fourth MOS transistors being provided to the plural areas;

wherein each of the areas includes at least a third MOS transistor of the second conductivity type, wherein a source of the third MOS transistor is connected to the second power supply line, a drain of the third MOS transistor is connected to the first power supply line and the substrate bias voltage of the third MOS transistor is supplied via the second substrate bias voltage supply line;

wherein a source-drain path of each of the fourth MOS transistor is provided between the second power supply line and the second substrate bias voltage supply line; and wherein the plurality of the fourth MOS transistors are controlled to be ON state when the logic circuit is in the first state.

5. The semiconductor integrated circuit device according to claim 1, further comprising:

a first substrate bias voltage generator to generate a first voltage;

wherein when the logic circuit is in the second state, the plurality of the second MOS transistors are controlled to be OFF state and the first voltage is supplied to the first MOS transistors via the first substrate bias voltage supply line from the first substrate bias voltage generator.

6. The semiconductor integrated circuit device according to claim 4, further comprising:

a second substrate bias voltage generator to generate a second voltage;

wherein when the logic circuit is in the second state, the plurality of the fourth MOS transistors are controlled to be OFF state and the second voltage is supplied to the third MOS transistors via the second substrate bias voltage supply line from the second substrate bias voltage generator.

* * * * *